(12) United States Patent
Ye

(10) Patent No.: US 12,063,445 B2
(45) Date of Patent: Aug. 13, 2024

(54) ANALOG-TO-DIGITAL CONVERSION SYSTEMS AND METHODS WITH PULSE GENERATORS

(71) Applicant: Teledyne FLIR Commercial Systems, Inc., Goleta, CA (US)

(72) Inventor: Kevin N. Ye, Goleta, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 474 days.

(21) Appl. No.: 17/362,876

(22) Filed: Jun. 29, 2021

(65) Prior Publication Data

US 2021/0329187 A1    Oct. 21, 2021

Related U.S. Application Data

(63) Continuation of application No. PCT/US2019/063436, filed on Nov. 26, 2019.

(60) Provisional application No. 62/787,200, filed on Dec. 31, 2018.

(51) Int. Cl.
*H04N 25/75* (2023.01)
*H03M 1/52* (2006.01)
*H03M 1/56* (2006.01)

(52) U.S. Cl.
CPC .............. *H04N 25/75* (2023.01); *H03M 1/52* (2013.01); *H03M 1/56* (2013.01)

(58) Field of Classification Search
CPC ........... H04N 25/75; H03M 1/52; H03M 1/56
See application file for complete search history.

(56) References Cited

U.S. PATENT DOCUMENTS 6,608,513 B2    8/2003  Tschanz et al.
10,084,468 B1 *  9/2018  Boemler ................. H03M 1/38
(Continued)

FOREIGN PATENT DOCUMENTS

EP    0502368    9/1992

OTHER PUBLICATIONS

Le-Thai Ha et al: "A 0.18-um CMOS Image Sensor With Phase-Delay-Counting and Oversampling Dual-Slope Integrating Column ADCs Achieving le-rms Noise at 3.8-us Conversion Time", IEEE Journal of Solid-State Circuits, IEEE, USA, vol. 53, No. 2, Oct. 11, 2017 (Oct. 11, 2017), pp. 515-526, XP011676245, ISSN: 0018-9200, DOI: 10.1109/JSSC.2017.2751610 [Jan. 26, 2018].

*Primary Examiner* — Kyu Chae
(74) *Attorney, Agent, or Firm* — Haynes and Boone, LLP

(57) ABSTRACT

Techniques are disclosed for analog-to-digital conversion systems and methods with pulse generators. In one example, an imaging system includes an analog-to-digital converter (ADC). The ADC includes a comparator configured to generate a comparator output signal based on a first signal and a second signal. The comparator output signal is associated with a first state or a second state. The ADC further includes a pulse generator coupled to the comparator. The pulse generator is configured to generate a pulse signal in response to a transition of the comparator output signal from the first state to the second state. The ADC further includes a memory device coupled to the pulse generator. The memory device is configured to capture a counter value from a counter circuit in response to the pulse signal. The counter value is associated with the detector signal. Related methods are also provided.

20 Claims, 12 Drawing Sheets

(56) References Cited

U.S. PATENT DOCUMENTS

| | | | |
|---|---|---|---|
| 2003/0102885 A1* | 6/2003 | Tsuboi | G11C 29/46 |
| | | | 326/16 |
| 2013/0214760 A1 | 8/2013 | Hancock | |
| 2017/0245333 A1* | 8/2017 | Kim | H05B 45/30 |
| 2017/0339358 A1* | 11/2017 | Le-Thai | H03M 1/1205 |
| 2018/0124336 A1* | 5/2018 | Jonas | H04N 25/772 |

* cited by examiner

ANALOG-TO-DIGITAL CONVERSION SYSTEMS AND METHODS WITH PULSE GENERATORS

CROSS-REFERENCE TO RELATED APPLICATIONS

This application is a continuation of International Patent Application No. PCT/US2019/063436 filed Nov. 26, 2019 and entitled "ANALOG-TO-DIGITAL CONVERSION SYSTEMS AND METHODS WITH PULSE GENERATORS," which is hereby incorporated by reference in its entirety.

International Patent Application No. PCT/US2019/063436 claims priority to and the benefit of U.S. Provisional Patent Application No. 62/787,200 filed Dec. 31, 2018 and entitled "ANALOG-TO-DIGITAL CONVERSION SYSTEMS AND METHODS WITH PULSE GENERATORS," which is hereby incorporated by reference in its entirety.

TECHNICAL FIELD

One or more embodiments relate generally to imaging systems and more particularly, for example, to analog-to-digital conversion systems and methods with pulse generators.

BACKGROUND

Imaging systems may include an array of detectors, with each detector functioning as a pixel to produce a portion of a two-dimensional image. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imaging systems.

SUMMARY

In one or more embodiments, an imaging system includes an analog-to-digital converter including a comparator configured to generate a comparator output signal based on a first signal and a second signal. The comparator output signal is associated with a first state or a second state. The analog-to-digital converter further includes a pulse generator coupled to the comparator. The pulse generator is configured to generate a pulse signal in response to a transition of the comparator output signal from the first state to the second state. The analog-to-digital converter further includes a memory device coupled to the pulse generator. The memory device is configured to capture a counter value from a counter circuit in response to the pulse signal. The counter value is associated with the first signal.

In one or more embodiments, for a method of analog-to-digital conversion, the method includes generating, by a comparator, a comparator output signal based on a first signal and a second signal. The comparator output signal is associated with a first state or a second state. The method further includes, in response to a transition of the comparator output signal from the first state to the second state, generating, by a pulse generator coupled to the comparator, a pulse signal. The method further includes, in response to the pulse signal, capturing, by a memory device coupled to the pulse generator, a counter value from a counter circuit. The counter value is associated with the first signal.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
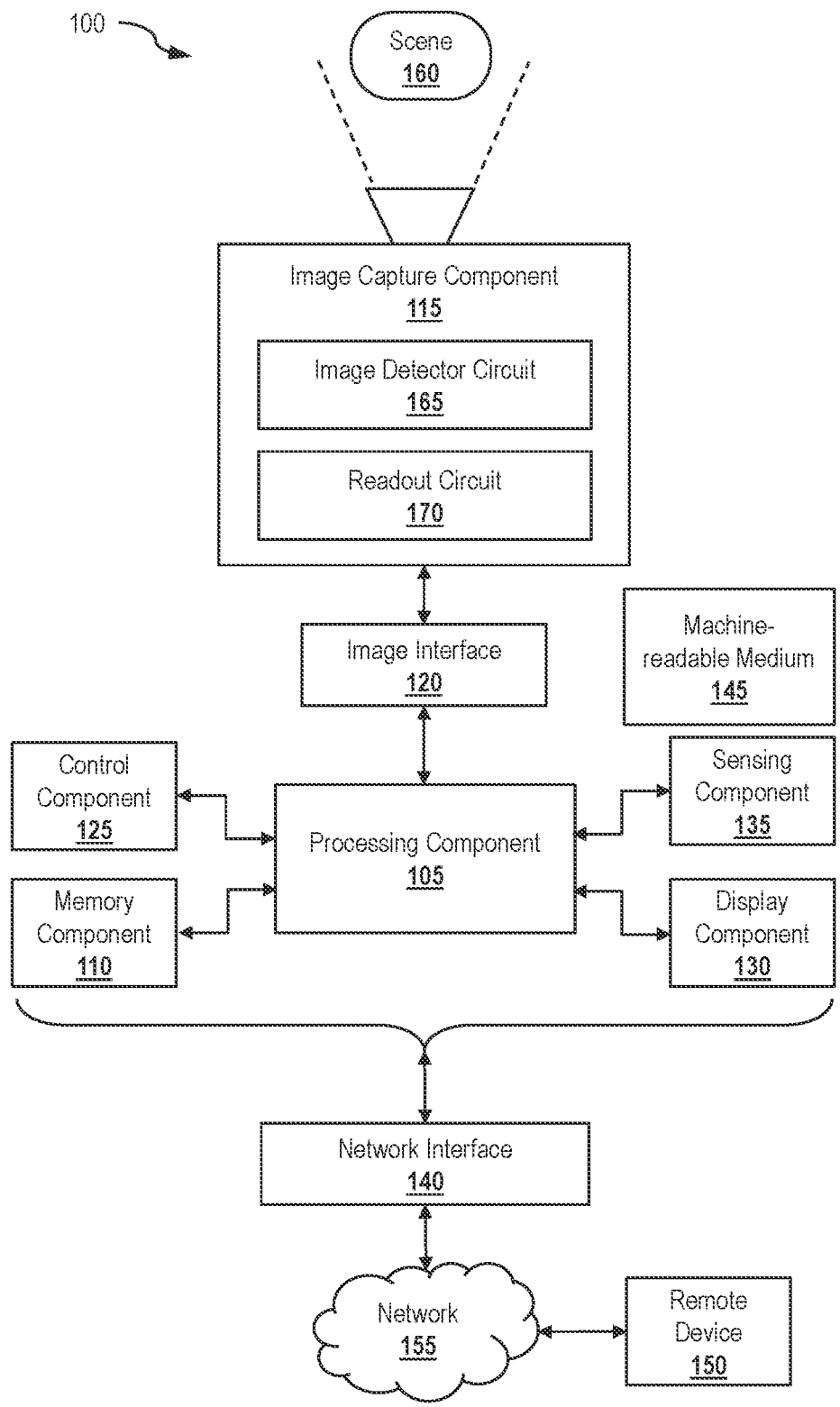
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims. It is noted that sizes of various components are not necessarily drawn to scale in the drawings.

In some embodiments, an imaging system is provided for converting analog signals to their digital representation. The analog signals may include detector signals (e.g., detector voltages, detector currents) generated by detectors of the imaging system in response to incident electromagnetic radiation. In an embodiment, the imaging system includes a detector array, an analog-to-digital converter (ADC), and a readout circuit. In some cases, the ADC may be implemented as part of the detector array or the readout circuit.

The ADC may include comparators, pulse generators, and a memory device. Each comparator may generate a comparator output signal based on a reference signal and a respective detector signal (e.g., from a respective detector of the detector array). The reference signal may be generated by a reference generator. In some cases, the reference generator may be a ramp generator. In an aspect, the reference generator may begin ramping up the reference signal while, synchronously, a counter circuit begins incrementing a counter value (e.g., also referred to as a digital count value or simply a count value). The comparator output signal may be associated with a first state or a second state. For example, the comparator output signal may be associated with the first state when the reference signal does not exceed the detector signal, and may be associated with the second state when the reference signal exceeds the detector signal.

The pulse generator may generate a pulse signal in response to a transition of the comparator output signal from the first state to the second state. The memory device may receive the pulse signal and capture (e.g., latch, store) a counter value from the counter circuit in response to the pulse signal. In an aspect, the memory device may be static memory (e.g., static latch memory). In another aspect, the memory device may be dynamic memory. In some cases, the counter value is a digital representation of the detector signal. In other cases, the digital representation of the detector signal is based in part on the counter value.

In some aspects, utilisation of pulse generators may facilitate reduced power consumption relative to a case in which comparators are directly connected to memory (e.g., without intervening pulse generators). In this regard, power consumption of memory elements may primarily be associated with the moment of capturing the counter value (e.g., for the duration of the pulse signal utilized to capture the counter value) generated by the counter circuit. At other times, the memory element does not capture the counter value generated by the counter circuit. In the case that comparators are directly providing comparator output signals to memory elements, the memory elements may store each counter value received from a counter circuit and thus consume power each time the counter circuit adjusts its counter value. For instance, a memory element may store each counter value received from the counter circuit while the comparator output signal applied to the memory element remains at logic high. In some cases, the pulse generators may act as output buffers to drive the memory elements. In acting as output buffers, the pulse generators may facilitate faster transitions, which may enable higher speed ADC designs.

In some embodiments, the ADC may include integrators that generate and provide integrator output signals to the comparators. The integrators may generate these signals based on the detector signals or a reference signal. In an aspect, the integrators may generate signals based on the detector signals for a predetermined amount of time, and then generate signals based on the reference signal after the predetermined amount of time has elapsed. In one case, the integrator output signals generated by the integrators may follow a positive slope until the predetermined amount of time has elapsed, and then follow a negative slope afterwards. The positive slope may be based on the detector signals. The comparators may compare the integrator output signals with a threshold level (e.g., threshold voltage level) and generate comparator output signals based on the comparison. A comparator output signal may be associated with a first state or second state. For example, the comparator output signal may be associated with the first state when the integrator output signal does not exceed the threshold level, and may be associated with the second state when the integrator output signal exceeds the threshold level. The pulse generator may generate a pulse signal in response to a transition of the comparator output signal from the first state to the second state. The memory device may receive the pulse signal and capture (e.g., latch, store) a counter value from the counter circuit in response to the pulse signal.

Multi-stage conversions (e.g., also referred to as multi-step conversions) may be provided in some embodiments. In some aspects, multi-stage conversions are associated with multiple reference signals to be selectively provided to the integrators and multiple threshold levels to be utilized as a basis for comparison by the comparators. Each stage of the conversion may have associated comparators (e.g., and appropriate threshold levels), associated pulse generators (e.g., to generate pulse signals based on a transition in comparator output signals), and associated counter circuits. Each stage may be associated with a counter value, such that the counter values from the stages collectively provide a digital representation of the detector signals. For example, in an ADC that facilitates two-step conversions, for a given detection signal, a first step may provide a coarse representation of the detector signal while a second step may provide a fine component associated the detector signal. The coarse representation and fine component may be combined to obtain a total counter value that provides a digital representation of the detector signal. In some cases, the coarse representation may be most significant bits of the total counter value and the fine component may be least significant bits of the total counter value.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). The imaging system 100 may include a housing that at least partially encloses components of the imaging system 100, such as to facilitate compactness and protection of the imaging system 100. For example, the solid box labeled 100 in FIG. 1 may represent the housing of the imaging system 100. The housing may contain more, fewer, and/or different components of the imaging system 100 than those depicted within the solid box in FIG. 1. In an embodiment, the imaging system 100 may include a portable device and may be incorporated, for example, into a vehicle or a non-mobile installation requiring images to be stored and/or displayed. The vehicle may be a land-based vehicle (e.g., automobile), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100. In another example, the imaging system 100 may be coupled to various types of fixed locations (e.g., a home security mount, a campsite or outdoors mount, or other location) via one or more types of mounts.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, etc.) of the imaging system 100 to perform such operations. For example, the processing component 105 may be configured to process captured image data received from the image capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The memory component 110 includes, in one embodiment, one or more memory devices configured to store data and information, including infrared image data and information. The memory component 110 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the image capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes an image detector circuit 165 (e.g., a thermal infrared detector circuit) and a readout circuit 170 (e.g., an ROIC). For example, the image capture component 115 may include an IR imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) short-wave IR (SWIR) radiation, mid-wave IR (MWIR) radiation (e.g., EM radiation with wavelength of 2-5 μm) and/or long-wave IR (LWIR) radiation (e.g., EM radiation with wavelength of 7-14 μm), or any desired IR wavelengths (e.g., generally in the 0.7 to 14 μm range). In other aspects, the image detector circuit 165 may capture radiation from one or more other wavebands of the EM spectrum, such as visible-light, ultra-violet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector. By way of non-limiting example, each detector may be a photodetector, such as an avalanche photodiode, an infrared photodetector, a quantum well infrared photodetector, a microbolometer, or other detector capable of converting EM radiation (e.g., of a certain wavelength) to a pixel value. The array of detectors may be arranged in rows and columns. Although the present disclosure generally refers to various operations performed on rows and/or columns, rows may be used as columns and columns may be used as rows as appropriate.

In an aspect, the imaging system 100 (e.g., the image capture component 115 of the imaging system 100) may include one or more optical elements (e.g., mirrors, lenses, beamsplitters, beam couplers, etc.) to direct EM radiation to the image detector circuit 165. In some cases, an optical element may be at least partially within the housing of the imaging system 100.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an embodiment, the pixel values generated by the image detector circuit 165 may be represented in terms of digital count values generated based on the electrical signals obtained from converting the detected radiation. For example, in a case that the image detector circuit 165 includes or is otherwise coupled to an ADC circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period). In some cases, ADC circuits to generate digital count values for detectors of the image detector circuit 165 may be implemented as part of the image detector circuit 165. In other cases, such ADC circuits may be implemented as part of the readout circuit 170.

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the image capture component 115 may include one or more filters adapted to pass radiation of some wavelengths but substantially block radiation of other wavelengths. For example, the image capture component 115 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the image capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may comprise an IR imaging sensor having an FPA of detectors responsive to IR radiation including near infrared (NIR), SWIR, MWIR, LWIR, and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include the network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component 105, all or part of the memory component 110, and/or all of part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, the image capture component 115, the image interface 120, the display component 130, the sensing component 135, and/or the network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2A:
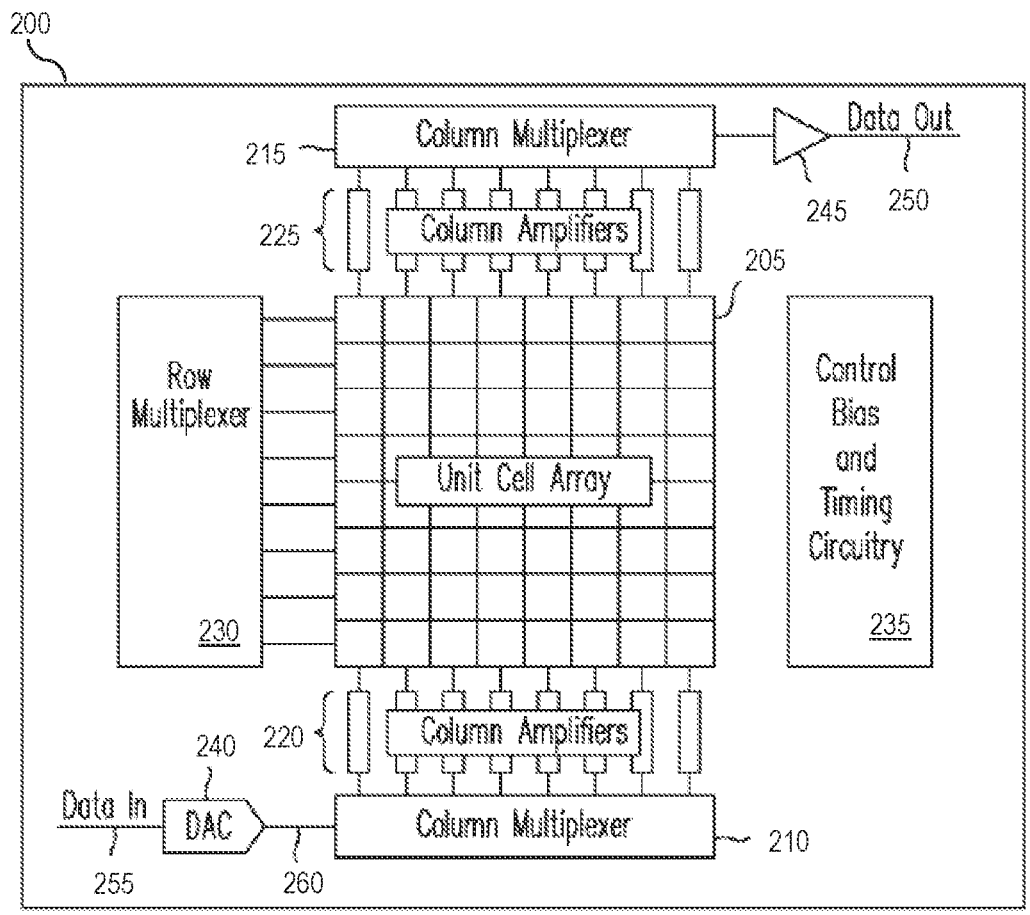
FIG. 2A illustrates a block diagram of an example image sensor assembly in accordance with one or more embodiments of the present disclosure.

FIG. 2A illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the image capture component 115 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector and interface circuitry. The interface circuitry of each unit cell may provide an output signal, such as an output voltage or an output current, in response to a detector signal (e.g., detector current, detector voltage) provided by the detector of the unit cell. The output signal may be indicative of the magnitude of EM radiation received by the detector. The column multiplexer 215, the column amplifiers 220, the row multiplexer 230, and the data output buffer 245 may be used to provide the output signals from the unit cell array 205 as a data output signal on a data output line 250. The output signals on the data output line 250 may be provided to components downstream of the image sensor assembly 200, such as processing circuitry (e.g., the processing component 105 of FIG. 1), memory (e.g., the memory component 110 of FIG. 1), display device (e.g., the display component 130 of FIG. 1), and/or other component to facilitate processing, storage, and/or display of the output signals. The data output signal may be an image formed of the pixel values for the image sensor assembly 200. In this regard, the column multiplexer 215, the column amplifiers 220, the row multiplexer 230, and the data output buffer 245 may collectively provide an ROIC (or portion thereof) of the image sensor assembly 200.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals (e.g., to obtain digital count values). These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

In an aspect, the control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilising the DAC 240. In this regard, some implementations do not include the DAC 240, the data input signal line 255, and/or the analog signal line(s) 260. In an embodiment, the control bias and timing circuitry 235 may be, may include, may be a part of, or may otherwise be coupled to the processing component 105 and/or image capture component 115 of FIG. 1.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (NUC), spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192× 8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 2B:
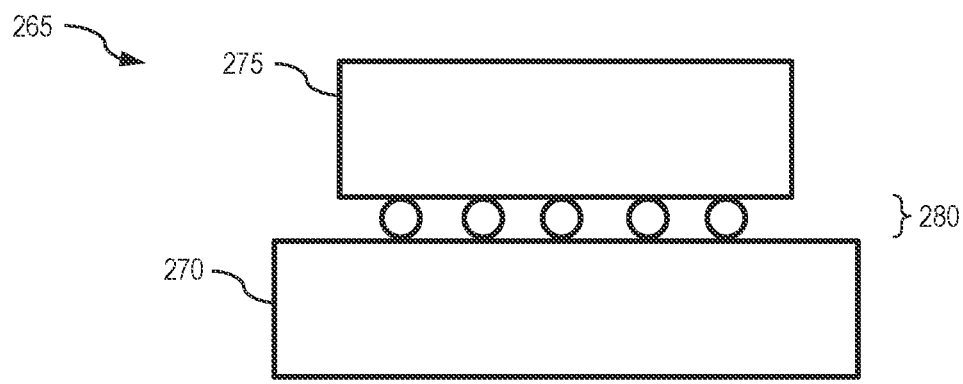
FIG. 2B illustrates an example image sensor assembly in accordance with one or more embodiments of the present disclosure.

In an embodiment, components of the image sensor assembly 200 may be implemented such that a detector array is hybridized to (e.g., bonded to) a readout circuit. For example, FIG. 2B illustrates an example image sensor assembly 265 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 265 may be, may include, or may be a part of, the image sensor assembly 200.

The image sensor assembly 265 includes a device wafer 270, a readout circuit 275, and contacts 280 to bond (e.g., mechanically and electrically bond) the device wafer 270 to the readout circuit 275. The device wafer 270 may include detectors (e.g., the unit cell array 205). The contacts 280 may bond the detectors of the device wafer 270 and the readout circuit 275. The contacts 280 may include conductive contacts of the detectors of the device wafer 270, conductive contacts of the readout circuit 275, and/or metallic bonds between the conductive contacts of the detectors and the conductive contacts of the readout circuit 275. For example, the contacts 280 may include contact layers formed on the detectors to facilitate coupling to the readout circuit 275. In one embodiment, the device wafer 270 may be bump-bonded to the readout circuit 275 using bonding bumps. The bonding bumps may be formed on the device wafer 270 and/or the readout circuit 275 to allow connection between the device wafer 270 and the readout circuit 275. In an aspect, hybridizing the device wafer 270 to the readout circuit 275 may refer to bonding the device wafer 270 (e.g., the detectors of the device wafer 270) to the readout circuit 275 to mechanically and electrically bond the device wafer 270 and the readout circuit 275.

Figure 3:
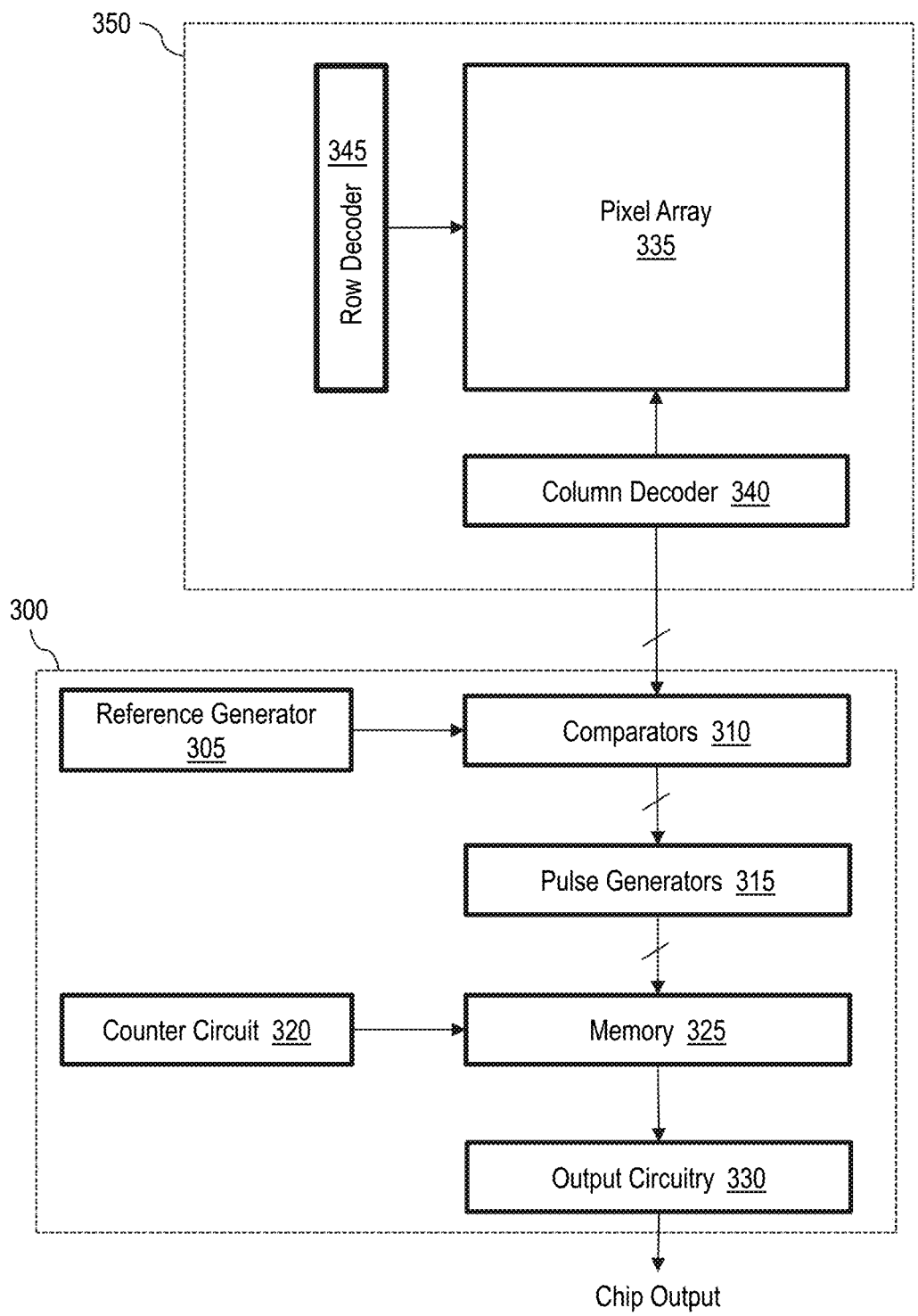
FIG. 3 illustrates a block diagram of an example analog-to-digital converter and associated image sensor circuitry in accordance with one or more embodiments of the present disclosure.

FIG. 3 illustrates a block diagram of an example ADC 300 and associated image sensor circuitry 350 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The image sensor circuitry 350 includes a pixel array 335, a column decoder 340, and a row decoder 345. The pixel array 335 includes an array of detectors (e.g., photodetectors, microbolometers), with each detector detecting EM radiation and generating a pixel value based on the detected EM radiation. The pixel value of a detector may be, or may be indicative of, a detector signal (e.g., detector voltage, detector current) generated by the detector in response to the EM radiation. Pixel array data is multiplexed out using the column decoder 340 and the row decoder 345. In this regard, the column decoder 340 and the row decoder 345 may perform appropriate column addressing operations and row addressing operations to facilitate read out of pixel values generated by the detectors of the pixel array 335. The pixel values may then be provided to the ADC 300 for conversion. As an example, FIG. 3 illustrates a column parallel output architecture, in which data from each column is read out in parallel one row at a time. In this architecture, data may be sampled and held at the column level for conversion by the ADC 300. In an embodiment, the pixel array 335 may be, may include, or may be a part of, the unit cell array 205 of FIG. 2A.

The ADC 300 includes a reference generator 305, comparators 310, pulse generators 315, memory 325, output circuitry 330 and a counter circuit 320. The reference generator 305 generally represents any reference generator circuitry to generate reference values for electrical signals (e.g., voltages, currents) as appropriate for a given application. The reference generator 305 may sweep over a range of output values within a time duration. For explanatory purposes, the reference generator 305 generates a linearly rising output or a linearly falling output with respect to time. In this case, the reference generator 305 may be referred to as a ramp generator. As one example, the reference generator 305 may generate a ramp voltage. As another example, the reference generator 305 may generate a ramp current. In other embodiments, other types of ramp signals and/or, more generally, other types of reference signals may be generated by the reference generator 305 as appropriate for a given application.

The comparators 310 compare detector signals (e.g., detector voltages) with a reference signal (e.g., ramp voltage) generated by the reference generator 305 and generate comparator output signals based on the comparisons. In this regard, each of the comparators 310 may receive the reference signal and a detector signal from a detector of one of the columns of the pixel array 335, and generate a comparator output signal based on a comparison of the detector signal with the reference signal.

For explanatory purposes, the detector signal is a detector voltage and the reference signal is a ramp voltage. In this case, the detector signals from the detectors may be referred to as column voltages. For a given comparator of the comparators 310, the comparator receives a detector voltage from one of the detectors of the pixel array 335 and a ramp voltage from the reference generator 305, and generates a comparator output signal based on the comparison. In an aspect, the comparator may generate a comparator output signal at, or otherwise associated with, a first state/level when the ramp voltage does not exceed the detector voltage, and generate a comparator output signal at, or otherwise associated with, a second state/level different from the first level when the ramp signal exceeds the detector voltage. The first state/level may be a logic low (e.g., logic level '0') and the second state/level may be a logic high (e.g., logic level '1'), or vice versa. As an example, when the first state/level is a logic low and the second state/level is a logic high, the comparator output signal may transition from low when the ramp signal does not exceed the detector voltage to high when the ramp signal exceeds the detector voltage.

The pulse generators 315 receive comparator output signals from the comparators 310. In an aspect, for a given pulse generator of the pulse generators 315, the pulse generator may generate a pulse in response to a transition of a comparator output signal received by the pulse generator from the first state (e.g., logic low) to the second state (e.g., logic high). In this regard, an output transition from one of the comparators 310 may cause a corresponding one of the pulse generators 315 (e.g., the pulse generator coupled to the comparator) to transmit a pulse signal to a respective memory element (e.g., also referred to as a memory cell or a memory column) of the memory 325.

Memory elements of the memory 325 receive a pulse signal from their respective pulse generators 315, and, in response to the pulse signal, capture a digital count value from a counter circuit 320. In an embodiment, the memory 325 may be static memory (e.g., the memory elements may be static memory elements). The memory elements of the memory 325 may include, for example, a latch or flip-flop circuit to store data (e.g., the digital count value). In an aspect, the memory elements may include inverter devices or circuitry that are not actively driven by the counter circuit 320. The memory elements may include crossed-coupled inverters. In some cases, crossed-coupled inverters (e.g., two cross-coupled inverters) may be utilized in memory elements to mitigate (e.g., reduce, eliminate) memory leakage and/or facilitate scalability to smaller device fabrication nodes. The memory elements may include switches that can be controlled by the pulse signal. For example, a memory element may include a switch that closes in response to the pulse signal to couple the counter circuit 320 to the latch or flip-flop circuit to allow the digital count value to reach and be stored in the latch or flip-flop circuit. Otherwise, the switch may be open to decouple the counter circuit 320 from the latch or flip-flop circuit.

The counter circuit 320 adjusts a digital count value as a function of time. For example, the digital count value may be incremented according to a system clock, such as may be provided by the control bias and timing circuitry 235 of FIG. 2A. A counter period may refer to a duration of time between each adjustment (e.g., incrementing) of the digital counter value, or equivalently the amount of time that the digital counter value remains at the same value before being adjusted to its next value (e.g., increased by one to its next value or decreased by one to its next value depending on implementation). In an embodiment, the counter circuit 320 operates synchronously with the reference generator 305. The counter circuit 320 may synchronously adjust its digital count value in tandem with adjustment of the ramp voltage by the reference generator 305. As one example, the counter circuit 320 may begin incrementing its digital counter value when the reference generator 315 begins ramping up (e.g., linearly increasing) its ramp voltage. More generally, a voltage or a range of voltages of the ramp voltage generated by the reference generator 315 may be associated with (e.g., represented by, quantized into) a certain digital count value generated by the counter circuit 320. As such, in an embodiment, by capturing digital count values in response to pulse signals generated based on comparing the ramp voltage with detector voltages, the digital count values stored in the memory 325 are digital representations of the detector voltages generated by the detectors of the pixel array 335. The digital count value may also be referred to as a converted ADC value.

An output circuitry 330 may be coupled to the memory 325 and may be configured to further process digital data, such as the digital count values, stored in the memory 325 before transmission to a chip output. In one case, the output circuitry 330 may be considered or implemented as part of the ROIC, in which case the chip output may be referred to as an ROIC output. The chip output may be provided for processing, storage, and/or display by components downstream of the output circuitry 330 (e.g., processing circuits, memory, display devices, etc.).

It is noted that, while the foregoing describes the ADC 300 with a single reference generator and a single counter circuit, in some aspects, multiple reference generators and/or multiple counter circuits may be utilized. Each reference generator may be utilized to provide a reference signal (e.g., ramp voltage) to one or more of the comparators 310. Alternatively or in addition, each counter circuit may be utilized to provide a digital count value to one or more of memory elements of the memory 325.

Figure 4:
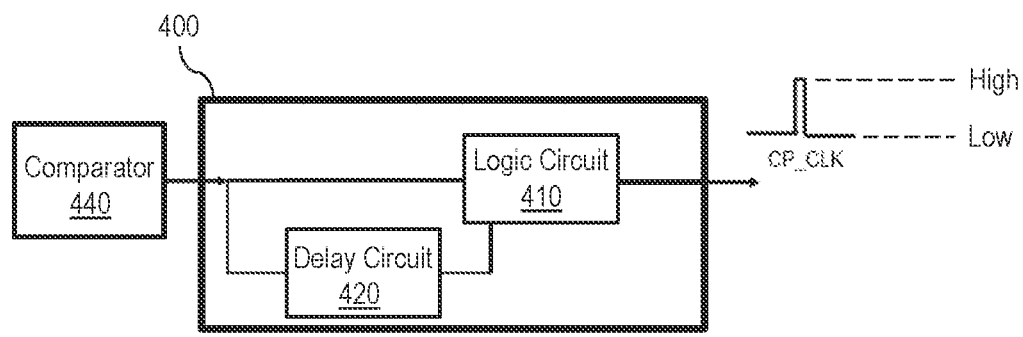
FIG. 4 illustrates an example pulse generator in accordance with one or more embodiments of the present disclosure.

FIG. 4 illustrates an example pulse generator 400 in accordance with one or more embodiments of the present disclosure. In an embodiment, the pulse generator 400 may be implemented, for example, as one of the pulse generators 315 shown in FIG. 3. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The pulse generator 400 includes a delay circuit 420 and a logic circuit 410. The pulse generator 400 is coupled to a comparator 440. In an embodiment, the comparator 440 may be one of the comparators 310 shown in FIG. 3. In an aspect, the pulse generator 400 receives a comparator output signal from the comparator 440 and generates a pulse signal in response to a transition of the comparator output signal (e.g., from low to high). The pulse signal may facilitate storage of a digital count value (e.g., generated by the counter circuit 320 of FIG. 3) into memory (e.g., memory cell of the memory 325 of FIG. 3). As an example, the pulse generator 400 may detect an edge of an output transition of the comparator 440 and generate a pulse signal (denoted as CP_CLK in FIG. 4) that is used as a clock by a memory device to capture a digital count value from a counter circuit. In an aspect, a memory cell (e.g., of the memory 325) may include a transmission gate and a latch or flip-flop. The pulse generator 400 may act as a buffer to drive the transmission gate(s) to allow the digital count value to be stored by the latch or flip-flop. In some cases, the pulse generator 400 acting as an output buffer to drive the transmission gate(s) may provide for faster transitions, which may enable higher speed ADC designs. In some cases, a time requirement (e.g., set by an application specification) associated with an analog comparator's output transition time may be reduced because the pulse generator 400 provides the final output clock to capture the digital count value.

The delay circuit 420 may receive a comparator output signal from the comparator 440 and generate a delayed version of the comparator output signal. In an aspect, the delay circuit 420 may include connections (e.g., wiring), serially connected buffers, and/or generally any components appropriate to effectuate a desired delay. The logic circuit 410 may receive the comparator output signal and the delayed version of the comparator output signal, combine (e.g., subtract) these signals to obtain a combined signal, and generate the pulse signal based on the combined signal. In some cases, the pulse signal may be the combined signal. In other cases, the logic circuit 410 may perform appropriate processing on the combined signal to generate the pulse signal, such as driving the combined signal to a logic high level and/or a logic low level appropriate for driving or not driving the memory element. In an aspect, driving a memory element may refer to causing the memory element to store a digital count value. For instance, the memory element may be considered to be driven by the pulse signal when the pulse signal causes a switch (e.g., transmission gate) of the memory element to close to allow storage of the digital count value. The memory element may be considered to not be driven by the pulse signal when the pulse signal does not cause the switch to close. It is noted that the pulse signal is generated in response to a transition of the comparator output signal from a first state to a second state. At other times (e.g., no transitions), the comparator output signal and its delayed version are the same or substantially the same, such that a subtraction of these signals can be considered a zero signal (e.g., which does not drive the memory element). In an aspect, a zero signal may be referred to as a zero pulse signal or no pulse signal.

Figure 5:
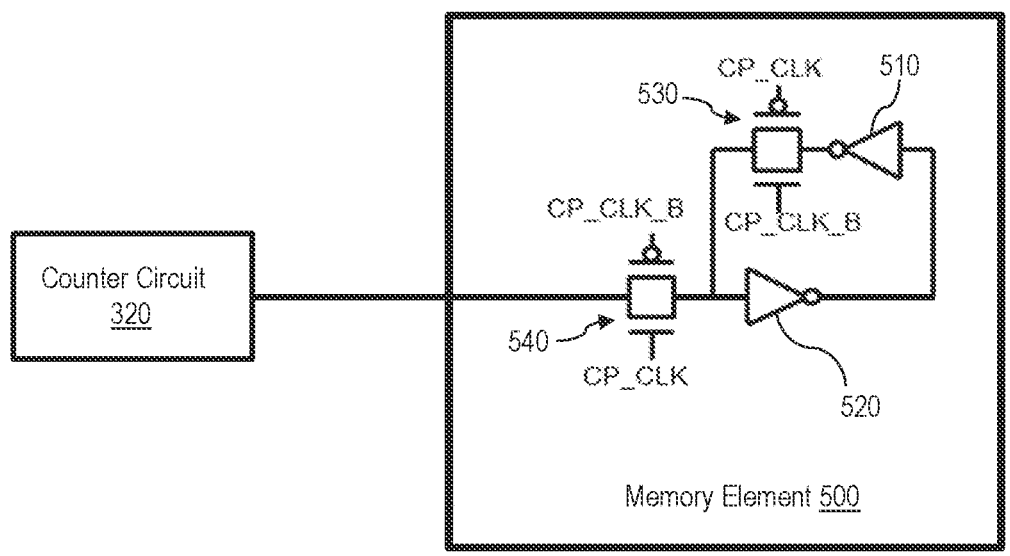
FIG. 5 illustrates a circuit diagram of a memory element in accordance with one or more embodiments of the present disclosure.

FIG. 5 illustrates a circuit diagram of a memory element 500 in accordance with an embodiment of the present disclosure. The memory element 500 may be implemented, for example, as a memory element of the memory 325 shown in FIG. 3. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The memory element 500 includes cross-coupled inverters 510 and 520 and transmission gates 530 and 540. The pulse signal (e.g., CP_CLK), as described with reference to FIG. 4, and a complementary pulse signal (e.g., CP_CLK_B) are applied to the transmission gates 530 and 540. In an aspect, as shown in FIG. 5, the transmission gates 530 and 540 may include p-type metal-oxide-semiconductor (PMOS) transistors and n-type metal-oxide-semiconductor (NMOS) transistors. In FIG. 5, when the pulse signal CP_CLK is at a logic high (and thus CP_CLK_B is at a logic low), the transmission gate 540 is turned on (e.g., also referred to as switched on or closed) and the transmission gate 530 is turned off (e.g., also referred to as switched off or open). By turning on the transmission gate 540, the memory element 500 is enabled by the pulse signal CP_CLK to capture the digital count value provided by the counter circuit 320 when the transmission gate 540 is closed. The digital count value may be, for example, stored in a latch circuit or flip-flop circuit. In FIG. 5, the latch circuit or flip-flop circuit may include the cross-coupled inverters 510 and 520. When the pulse signal CP_CLK is at a logic low (and thus CP_CLK_B is at a logic high), the transmission gate 540 is turned off and the transmission gate 530 is turned on. By turning off the transmission gate 540, digital count values provided by the counter circuit 320 when there is no pulse signal (e.g., or, equivalently, no transition in comparator output signal) are not stored by the memory element 500 using the cross-coupled inverters 510 and 520. In some cases, by implementing the cross-coupled inverters 510 and 520 in the memory element 500, memory leakage may be reduced relative to a case in which certain other types of memory elements are used.

Figure 6:
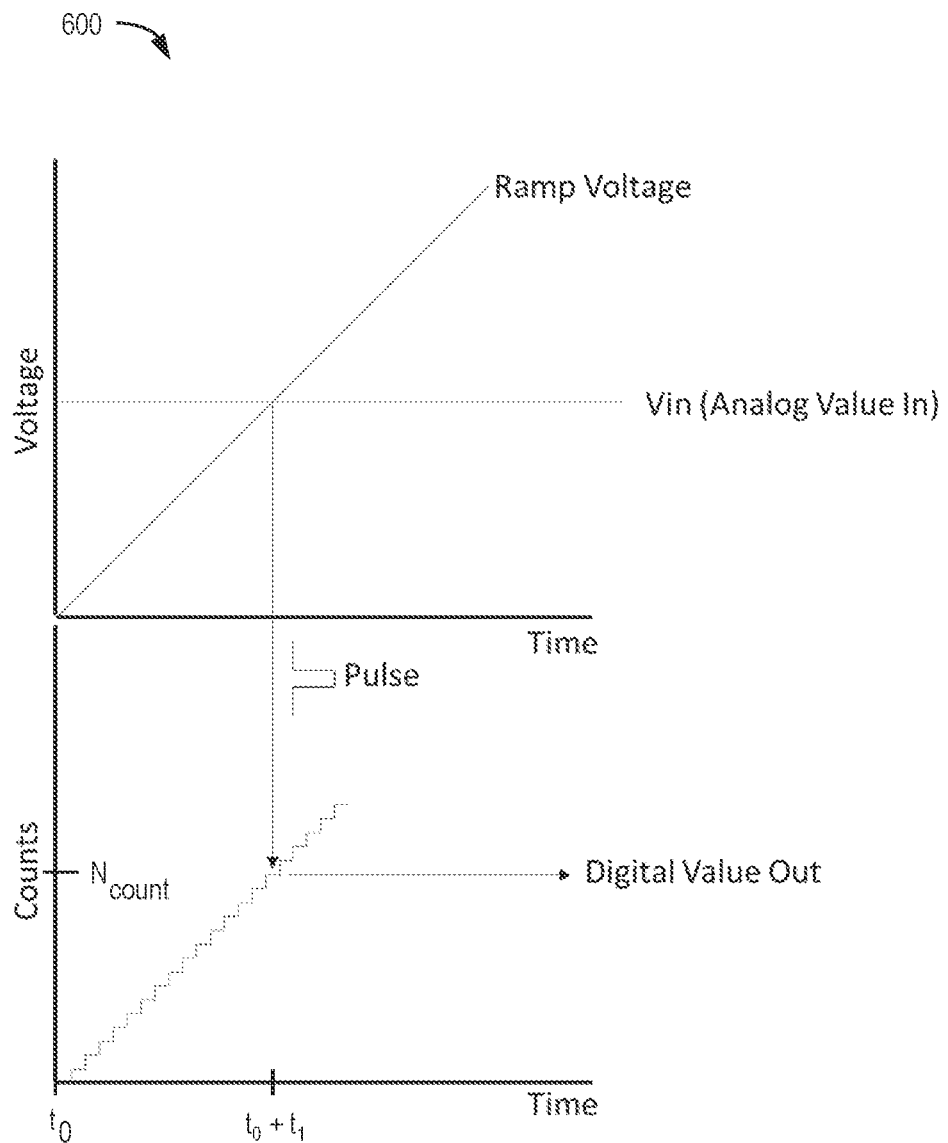
FIG. 6 illustrates a graph of a ramp voltage associated with a reference generator and digital count values associated with a counter circuit as a function of time in accordance with one or more embodiments of the present disclosure.

FIG. 6 illustrates a graph 600 of a ramp voltage associated with a reference generator and digital count values associated with a counter circuit as a function of time in accordance with one or more embodiments of the present disclosure. For example, the reference generator may be implemented by the reference generator 305 described in FIG. 3, and/or the counter circuit may be implemented by the counter circuit 320 described in FIG. 3. At a time $t=t_0$, the ramp voltage and the digital count value may be at a respective level. In FIG. 6, the ramp voltage and digital count value are shown to be at zero at time $t=t_0$. In other cases, the ramp voltage and/or the digital count value may be at a respective predetermined value (e.g., predetermined non-zero value) at time $t=t_0$. The digital count value incrementally increases with time. Synchronous with the digital count value incrementally increasing, the ramp voltage begins to ramp up (e.g., linearly increase) with time.

At a time $t=t_0+t_1$, when the ramp voltage is equal to (e.g., substantially equal to, slightly above) the detector voltage (denoted as $V_{in}$), a comparator (e.g., one of the comparators 310 of FIG. 3) transitions its comparator output voltage (e.g., from high to low or low to high dependent on implementation). A pulse generator (e.g., one of the pulse generators 315 of FIG. 3) detects an edge of the transitioning of the comparator output voltage, and generates a pulse signal (e.g., CP_CLK) to an input of a memory element (e.g., one of memory elements of the memory 325 of FIG. 3). The pulse signal causes a digital count value $N_{count}$, provided by the counter circuit at or around the time the pulse signal is received by the memory element to be stored in the memory element. In some cases, the pulse signal may be used as the clock for memory elements (e.g., of the memory 325) to capture and store the digital count value from the counter circuit (e.g., the counter circuit 320). In an aspect, a memory element may include a latch or flip-flop circuit that uses the clock to capture the digital count value. As an example, with reference to FIGS. 4 and 5, the pulse signal CP_CLK may activate (e.g., close, turn on) the transmission gate 540 for the duration that the CP_CLK is in the logic high state to allow the digital count value from the counter circuit 320 to be captured and stored by the memory element 500 using the cross-coupled inverters 510 and 520. It is noted that, while transmission gates are utilized to implement switches of the memory element 500, other switching circuits may be utilized (alternatively or in addition to transmission gates) as appropriate to facilitate storage of the digital count value by the memory element 500.

In some aspects, utilisation of pulse generators (e.g., the pulse generators 315 of FIG. 3) may facilitate reduced power consumption relative to a case in which comparators are directly connected to memory (e.g., without intervening pulse generators). In this regard, power consumption of the memory elements of the memory 325 may primarily be associated with the moment of capturing the digital count value (e.g., for the duration of the pulse signal utilized to capture the digital count value) generated by the counter circuit 320. At other times, the memory element does not capture the digital count values generated by the counter circuit 320. In the case that comparators are directly providing comparator output signals to memory elements, the memory elements may store each digital count value received from a counter circuit and thus consume power each time the counter circuit adjusts its digital count value. For instance, a memory element may store each digital count value received from the counter circuit while the comparator output signal applied to the memory element remains at logic high.

In an aspect, the pulse signal duration may be set to be less than a duration associated with a period of the counter circuit 320 (e.g., a duration of time between each adjustment of the digital counter value by the counter circuit 320). In some cases, setting the pulse signal duration to be less than the period associated with the counter circuit 320 may prevent the digital counter value stored by the memory element from changing over contiguous periods of the counter circuit 320 (e.g., for the duration that the pulse signal maintains the switch of the memory element in the closed state). Alternatively, or in addition, appropriate offset (e.g., to the digital counter value stored by the memory element) and/or other calibration terms may be applied, such as in a case that the pulse signal duration is not less than the period associated with the counter circuit 320. In one example, the pulse signal may have a duration (e.g., also referred to as pulse duration or pulse width) approximately between 1 ns and 2 ns.

As indicated previously, although the foregoing describes a reference generator (e.g., the reference generator 305) implemented to generate a linearly rising voltage, in other embodiments other types of signals may be generated by the reference generator 305. As one example, the reference generator may generate a linearly decreasing signal, rather than a linearly increasing signal. As another example, the reference generator may generate a signal different from a ramp signal. In this regard, the reference generator may generate any signal whose values can be appropriately associated with a corresponding digital count value from a counter circuit (e.g., the counter circuit 320). Furthermore, the counter circuit may adjust its digital count value in any predetermined matter, such as decrementing or other means, so long as each digital counter value is associated with a value or range of values of a signal generated by the reference generator.

Figure 7:
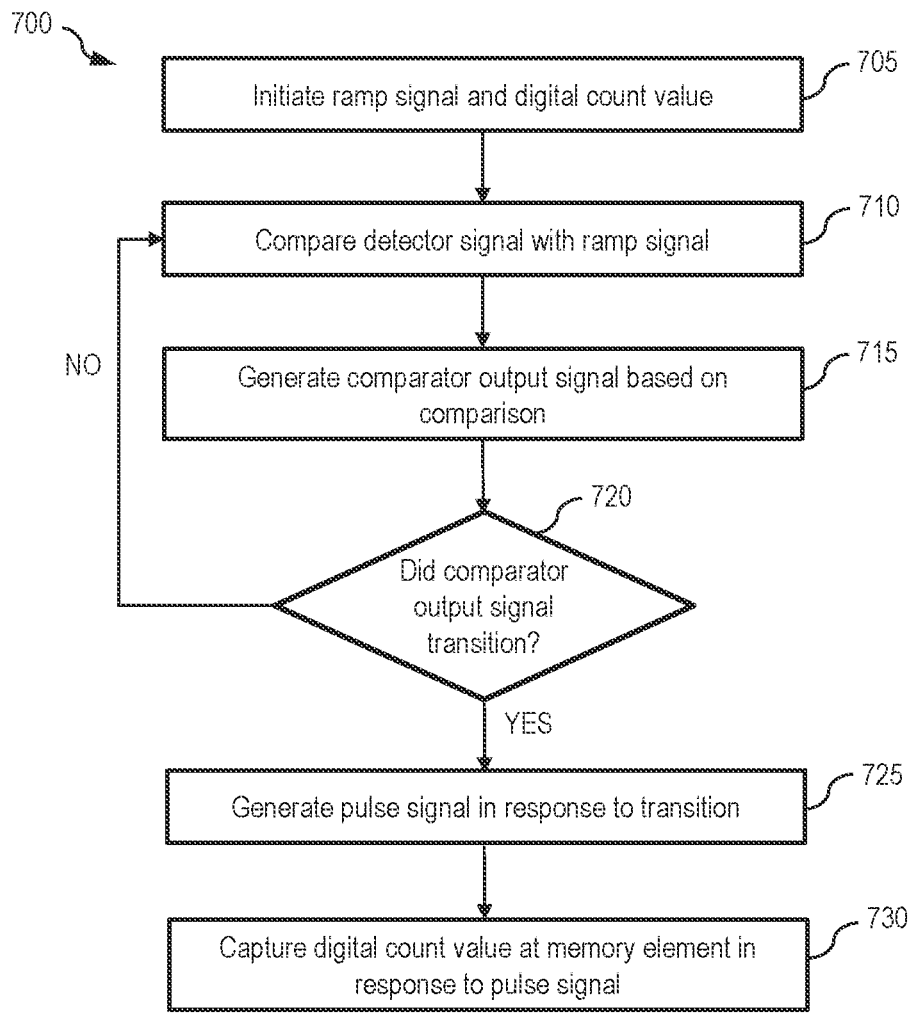
FIG. 7 illustrates a flow diagram of an example process for analog-to-digital conversion with a pulse generator in accordance with one or more embodiments of the present disclosure.

FIG. 7 illustrates a flow diagram of an example process 700 for analog-to-digital conversion with a pulse generator in accordance with one or more embodiments of the present disclosure. For explanatory purposes, the example process 700 is primarily described herein with reference to FIGS. 3-6; however, the example process 700 is not limited to FIGS. 3-6. The blocks of example process 700 are described herein as occurring in serial, or linearly (e.g., one after another). However, multiple blocks of example process 700 may occur in parallel. In addition, the blocks of example process 700 need not be performed in the order shown and/or one or more of the blocks of example process 700 need not be performed.

At block 705, a reference generator (e.g., the reference generator 305 of FIG. 3) generates a ramp voltage to be received by a comparator (e.g., one of the comparators 310 of FIG. 3) and a counter circuit (e.g., the counter circuit 320 of FIG. 3) generates a digital count value. For example, as shown in FIG. 6, the reference generator may ramp up in voltage in a linear manner and the counter circuit may increment its digital counter value in a linear manner. In an aspect, the reference generator ramps up the ramp voltage synchronously with the counter circuit incrementally increasing its digital count value. In this regard, for example, the ramp voltage may increase over time and, likewise, the digital count value may increase in increments over time.

At block 710, the comparator compares a detector voltage to the ramp voltage. The comparator may receive as input the detector voltage (e.g., from one of the detectors of the pixel array 335) and the ramp voltage (e.g., from the reference generator 305).

At block 715, the comparator generates a comparator output signal based on the comparison between the detector voltage and the ramp voltage. For example, the comparator may generate a comparator output signal at or associated with a first state (e.g., logic low) when the ramp voltage does not exceed the detector voltage, and the comparator may generate a comparator output signal at or associated with a second state (e.g., logic high) when the ramp voltage exceeds the detector voltage. In this example, the comparator output signal transitions from the first state to the second state once the ramp voltage increases to a level above the detector voltage.

At block 720, a determination is made, based on operation of the comparator and a pulse generator (e.g., one of the pulse generators 315 of FIG. 3), as to whether the comparator output signal transitioned (e.g., from the first state to the second state). If the determination is that the comparator output signal did not transition, the process 700 proceeds to block 710, in which the comparator continues to compare the ramp voltage to the detector voltage.

If the determination is that the comparator output signal transitioned, the process 700 proceeds to block 725. At block 725, a pulse generator (e.g., one of pulse generators 315 of FIG. 3) generates a pulse signal in response to the transition in the comparator output signal. The pulse generator may detect an edge of the comparator output transition. For example, the edge of the comparator output transition may be a rising edge or falling edge dependent on implementation. The pulse signal is provided to a memory element (e.g., of the memory 325 of FIG. 3). In an aspect, the pulse signal may be generated based on the comparator output signal and a delayed version of the comparator output signal. For instance, the comparator output signal and its delayed version may be combined (e.g., subtracted) to obtain a combined signal, where the pulse signal may be the combined signal or may be generated by processing the combined signal.

At block 730, the memory element captures a digital count value from a counter circuit (e.g., the counter circuit 320 of FIG. 3) in response to receiving the pulse signal from the pulse generator. The pulse signal may be used as a clocking signal for the memory element to capture the digital count value from the counter circuit. The memory element may include a latch that uses the pulse signal as a clocking signal to latch (e.g., store, capture) the digital count value from the counter circuit. Because the digital count value is captured in response to the pulse signal and the ramp voltage and digital count value are synchronized, the digital count value is indicative of the detector voltage. In this regard, the digital count value is a digital representation of the detector voltage.

Figure 8:
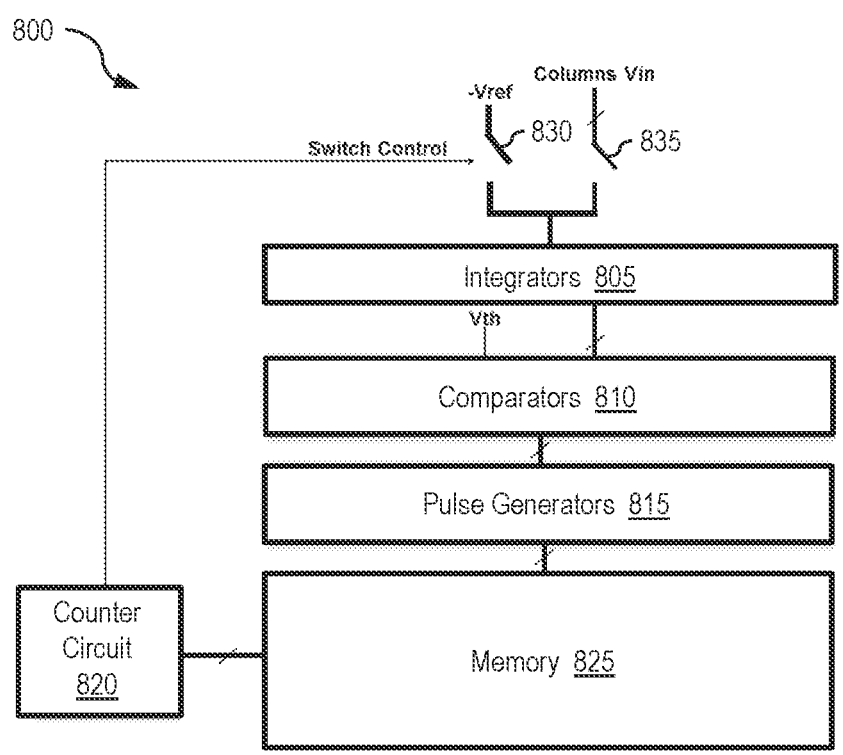
FIG. 8 illustrates a block diagram of an example analog-to-digital converter in accordance with one or more embodiments of the present disclosure.

FIG. 8 illustrates a block diagram of an example ADC 800 in accordance with one or more embodiments of the present disclosure. In an embodiment, the ADC 800 may be referred to as utilising a dual-slope architecture. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the ADC 800 may receive detector signals from the pixel array 335 of the image sensor circuitry 350 shown in FIG. 3. For example, in an embodiment, the ADC 800 may be utilized in place of the ADC 300 in FIG. 3.

The ADC 800 includes integrators 805, comparators 810, pulse generators 815, memory 825, and a counter circuit 820. In some embodiments, detector signals are detector voltages (e.g., also referred to as column voltages) and reference signals are reference voltages. In FIG. 8, the detector voltages are denoted as Columns $V_{in}$ and the reference voltages are denoted as $-V_{ref}$ and $V_{th}$. Other types of signals may be generated as appropriate for a given application. In an aspect, the reference voltages $-V_{ref}$ and $V_{th}$ may be generated using one or more reference generators (e.g., the reference generator 305). As an example, the detector signal may be a voltage approximately between 1 V and 3.3 V, a first reference signal may be a voltage $-V_{ref}$ approximately between $-2.5$ V and $-3.3$ V, and/or a second reference signal may be a voltage $V_{th}$ approximately between 0.5 V and 0.7 V. In some cases, the reference signal $-V_{ref}$ may be set to a level appropriate to accommodate a range of expected values for the detector signal.

Each integrator of the integrators 805 generates an integrator output signal based on an input signal provided to the integrator. In FIG. 8, each of the integrators 805 selectively receives a respective detector signal $V_{in}$ (e.g., generated by a respective detector of the pixel array 335) or selectively receives a reference signal $-V_{ref}$. In this regard, for a given integrator, its respective detector signal $V_{in}$ or the reference signal $-V_{ref}$ may be provided via switching as an input to the integrator. Such switching may be implemented using switches 830 and 835.

Each of the integrators 805 may receive a detector signal from a detector of a column of a pixel array (e.g., the pixel array 335 of FIG. 3) when a corresponding column switch (e.g., a respective one of the switches 835) is closed. When the corresponding column switch is closed, the integrator generates an integrator output signal based on the detector signal. Each of the integrators 805 may receive the reference signal (e.g., from the reference generator 305) when a corresponding switch (e.g., a respective one of the switches 830) is closed. When this switch is closed, the integrator generates an integrator output signal based on the reference signal. When the integrator output signal is generated based on the detector signal, the slope of the integrator output signal is based on (e.g., proportional to) the detector signal. When the integrator output signal is generated based on the reference signal $-V_{ref}$, the slope of the integrator output signal is based on (e.g., proportional to) the reference signal $-V_{ref}$. In an aspect, the integrator output signal may have slopes of opposite polarity based on whether the integrator output signal is generated based on the detector signal or the reference signal. As an example, the integrator output signal may ramp up (e.g., linearly increase) when generated based on the detector signal $V_{in}$, and the reference signal may be set such that the integrator output signal ramps down (e.g., linearly decreases) when generated based on the reference signal $-V_{ref}$.

The comparators 810 compare output signals (e.g., output voltages) from the integrators 805 with a reference signal $V_{th}$ (e.g., also referred to as reference voltage or threshold voltage) and generates comparator output signals based on the comparisons. For a given comparator of the comparators 810, the comparator receives an integrator output signal from an integrator (e.g., a corresponding integrator of the integrators 805) and the reference signal $V_{th}$, and generates a comparator output signal based on a comparison of the signals. In an aspect, the comparator may generate a comparator output signal at or otherwise associated with a first state/level when the integrator output signal exceeds the reference signal $V_{th}$, and generate a comparator output signal at or otherwise associated with a second state/level different from the first level when the integrator output signal does not exceed the reference signal $V_{th}$. The first state/level may be a logic low (e.g., logic level '0') and the second state/level may be a logic high (e.g., logic level '1'), or vice versa. As an example, when the first state/level is a logic low and the second state/level is a logic high, the comparator output transitions from low when the integrator output signal exceeds the reference signal $V_{th}$ to high when the integrator output signal does not exceed the reference signal $V_{th}$.

The pulse generators 815 receive comparator output signals from the comparators 810. In an aspect, for a given pulse generator of the pulse generators 815, the pulse generator may generate a pulse in response to a transition of a comparator output signal received by the pulse generator (e.g., from a corresponding one of the comparators 810) from the first state (e.g., logic low) to the second state (e.g., logic high). In this regard, an output transition from the corresponding one of the comparators 810 may cause the pulse generator to transmit a pulse signal to a respective memory element of the memory 825. In some cases, the pulse signal may be approximately between 1 ns and 2 ns in duration. In an aspect, the pulse signal duration may be set to be less than a duration associated with a period of the counter circuit 820.

Memory elements of the memory 825 receive a pulse signal from their respective pulse generators 815, and, in response to the pulse signal, capture a digital count value from the counter circuit 820. In an embodiment, the memory 825 may be static memory (e.g., the memory elements may be static memory elements). The memory elements of the memory 825 may include, for example, a latch or flip-flop circuit to store data (e.g., the digital count value). In an aspect, the memory elements may include inverter devices or circuitry that are not actively driven by the counter circuit 820. The memory elements may include crossed-coupled inverters. In some cases, crossed-coupled inverters (e.g., two cross-coupled inverters) may be utilized in memory elements to mitigate (e.g., reduce, eliminate) memory leakage and/or facilitate scalability to smaller device fabrication nodes.

The counter circuit 820 adjusts a digital count value as a function of time. For example, the digital count value may be incremented according to a system clock, such as may be provided by the control bias and timing circuitry 235 of FIG. 2A. In an embodiment, the counter circuit 820 operates synchronously with the integrators 805. The counter circuit 820 may synchronously adjust its digital count value in tandem with adjustment of the integrator output signal of one or more of integrators 805. As one example, the counter circuit 820 may begin incrementing its digital counter value when the integrators 805 begin ramping up (e.g., linearly increasing) based on the detector signals to cause a first ramp (e.g., also referred to herein as a first slope). Synchronously with the integrators 805 switching from utilizing its respective detector signal as its input to utilizing the reference signal $-V_{ref}$ as its input, the counter circuit 820 may reset its digital count value (e.g., to a zero value or other predetermined value). After the counter circuit 820 has been reset, the counter circuit 820 may begin to increment its digital counter value again, and synchronously the integrators 805 may begin ramping down (e.g., linearly decreasing) based on the reference signal $-V_{ref}$ to cause a second ramp (e.g., also referred to as a second slope). More generally, a voltage or a range of voltages of the second slope generated by the integrators 805 may be associated with (e.g., represented by, quantized into) a certain digital count value generated by the counter circuit 820. When the integrator output signal is generated based on the detector signal $V_{in}$, the slope of the integrator output signal is based on (e.g., proportional to) the detector signal $V_{in}$. When the integrator output signal is generated based on the reference signal $-V_{ref}$, the slope of the integrator output signal is based on (e.g., proportional to) the reference signal $-V_{ref}$. As such, in an embodiment, the digital count values stored in the memory 825 are digital representations of the detector signals generated by the detectors of the pixel array 335.

Figure 9:
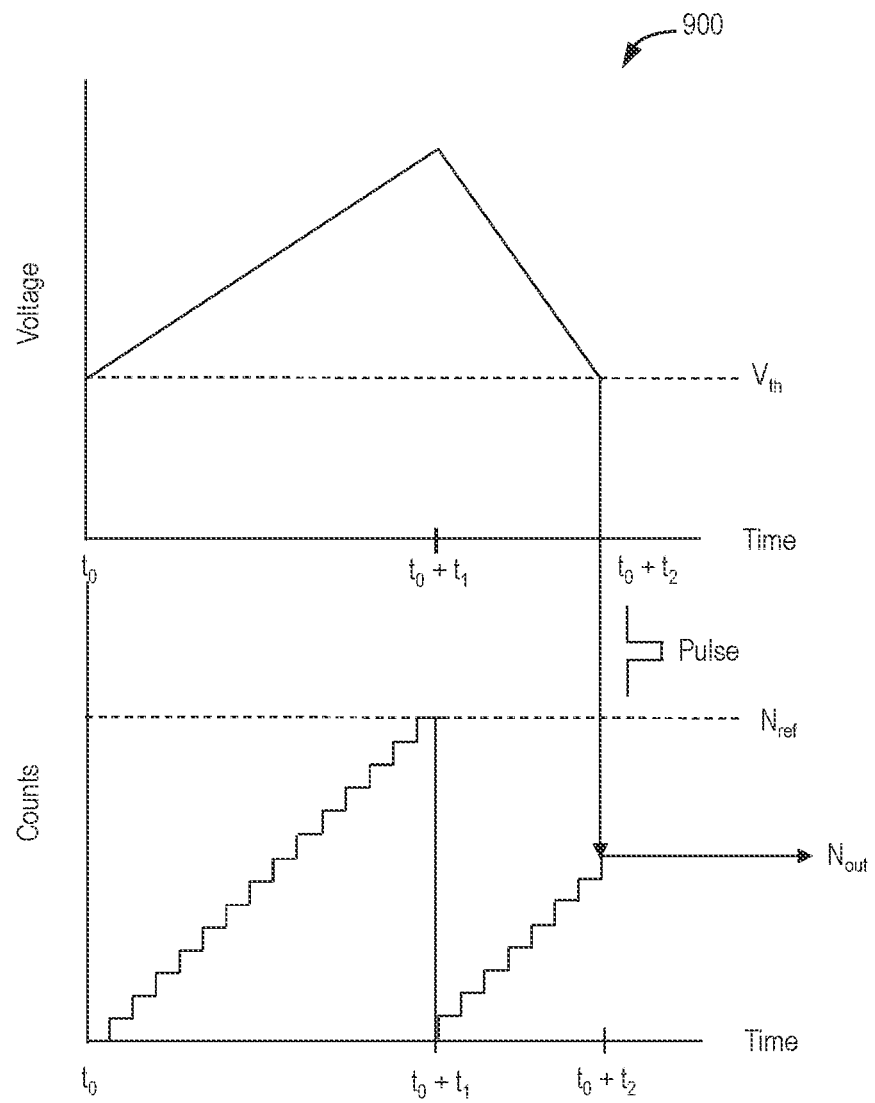
FIG. 9 illustrates a graph associated with operation of the analog-to-digital converter of FIG. 8 in accordance with one or more embodiments of the present disclosure.

FIG. 9 illustrates a graph 900 associated with operation of the ADC 800 in accordance with one or more embodiments of the present disclosure. Initially, in an embodiment, to facilitate conversion of detector signals from a pixel array (e.g., the pixel array 335 of FIG. 3), each of the integrators 805 and the counter circuit 820 may be reset at a time $t=t_0$. For example, the reset may be performed such that the counter circuit 820 is at a zero digital count value and the integrator output is at a threshold voltage (e.g., the reference signal $V_{th}$). In an aspect, the threshold voltage may be based on design of the comparators 810. For a given integrator, when a corresponding one of the switches 835 is closed (and the switches 830 are open), the integrator generates a voltage ramp having a positive slope (e.g., the first ramp or slope) beginning from the reference voltage $V_{th}$. In an aspect, the slope of the voltage ramp is proportional to the detector signal provided as an input to the integrator. The counter circuit 820 may synchronously adjust its digital count value in tandem with adjustment of the ramp voltage generated by the integrators 805.

At time $t=t_0+t_1$ (e.g., after a duration $t_1$ has passed since beginning to ramp up the integrator output voltage and the counter value), logic circuitry may be used to generate one or more switching signals to cause the switches 835 to open and the switches 830 to close. In this manner, the integrators 805 switch from receiving the detector signals $V_{in}$ as input to receiving the reference signal $-V_{ref}$ as input. The digital count value is at $N_{ref}$ at $t=t_1$. In an aspect, $t_1$ may be a predetermined amount of time set by a user. In some cases, the logic circuitry may decode an output of the counter circuit 820 to generate the switching signal(s). The logic circuitry may be implemented as part of the counter circuit 820 or otherwise coupled to the counter circuit 820. The counter circuit 820 resets the digital count value synchronously with switching the integrator inputs from the detector signals $V_{in}$ to the reference signal $-V_{ref}$. In other words, the counter circuit 820 resets the digital count value at or around $t=t_0+t_1$. After the input to the integrator has been switched to the reference signal $-V_{ref}$ and the counter circuit 820 has been reset, the integrator begins to generate a downward ramp (e.g., linearly decreasing slope) while the counter circuit 820 begins incrementally increasing the digital count value again.

Each of the comparators 810 may compare an integrator output signal from a respective one of the integrators 805 with the reference voltage $V_{th}$. In some cases, the comparisons are utilized to determine the moment the integrator output signal equals or does not exceed the reference voltage $V_{th}$. The moment that the comparator determines that the integrator output signal equals or does not exceed the reference voltage $V_{th}$ (e.g., denoted as $t=t_0+t_2$), the comparator output signal transitions from high to low or low to high depending on implementation. For example, in the high to low implementation, the comparator output signal may be at or associated with a logic high state when the integrator output signal exceeds the reference voltage $V_{th}$, and at or associated with a logic low state when the integrator output signal does not exceed the reference voltage $V_{th}$.

Each of the pulse generators 815 determines a rising or falling edge associated with a respective comparator output signal transition received by the pulse generator and, in response, generates a pulse signal. For a given pulse signal, the pulse signal may be received at a memory element (e.g., one of the memory elements of the memory 825), and, in response to receiving the pulse signal, the memory element may capture the digital count value (denoted as $N_{out}$ in FIG. 9) of the counter circuit 820. In an aspect, the digital count value $N_{out}$ may be $N_{out}=N_{ref}\times(V_{in}/V_{ref})$. In some aspects, utilization of two slopes, as shown in the graph 900, may mitigate (e.g., reduce, eliminate) errors associated with comparator threshold values (denoted as $V_{th}$), ramp generator operation, and/or clock skews that may be present in a single-slope architecture with the added expense of increasing (e.g., doubling) conversion time.

Figure 10:
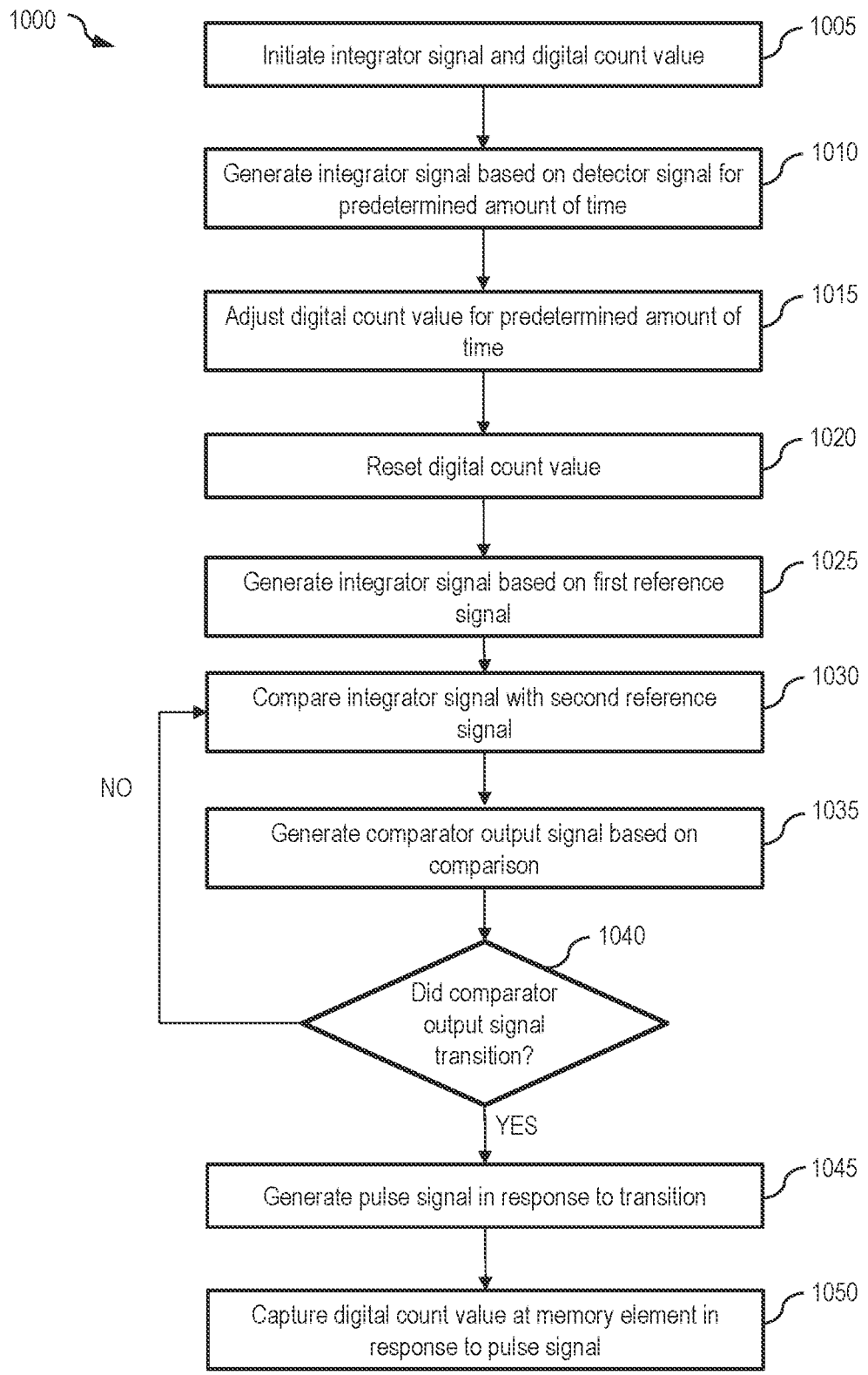
FIG. 10 illustrates a flow diagram of an example process for analog-to-digital conversion with a pulse generator in accordance with one or more embodiments of the present disclosure.

FIG. 10 illustrates a flow diagram of an example process 1000 for analog-to-digital conversion with a pulse generator in accordance with one or more embodiments of the present disclosure. For explanatory purposes, the example process 1000 is primarily described herein with reference to FIGS. 8 and 9; however, the example process 1000 is not limited to FIGS. 8 and 9. The blocks of example process 1000 are described herein as occurring in serial, or linearly (e.g., one after another). However, multiple blocks of example process 1000 may occur in parallel. In addition, the blocks of example process 1000 need not be performed in the order shown and/or one or more of the blocks of example process 1000 need not be performed.

At block 1005, an integrator (e.g., one of the integrators 805) and a counter circuit (e.g., the counter circuit 820 of FIG. 8) are initiated from a reset state. In an aspect, in the reset state, the integrator output signal may be at a reference voltage $V_{th}$ and the digital count value may be at zero. With reference to FIG. 9, the initiation from the reset state may occur at time $t=t_0$.

At block 1010, the integrator generates an integrator output signal based on a detector signal $V_{in}$ (e.g., received by the integrator from one of the detectors of the pixel array 335 of FIG. 3). In an aspect, the integrator output signal may be generated based on the detector signal $V_{in}$ for a predetermined amount of time (e.g., configurable by a user). The integrator output signal may be provided to a comparator (e.g., one of the comparators 810 of FIG. 8). For example, the integrator output signal ramps up in voltage in a linear manner based on the detector voltage $V_{in}$ for the predetermined amount of time (e.g., denoted as $t_1$ in FIG. 9). In an embodiment, the detector signal $V_{in}$ is a detector voltage that the integrator receives as input when a first switch (e.g., a corresponding one of the switches 835 connected to the integrator) is closed, and a second switch (e.g., a corresponding one of the switches 830 connected to the integrator) is open.

At block 1015, the counter circuit 820 increments its digital counter value for the predetermined amount of time (e.g., denoted as $t_1$ in FIG. 9) or, equivalently, until a predetermined digital count value is reached (e.g., denoted as $N_{ref}$ in FIG. 9). In an aspect, the integrator ramps up its output signal synchronously with the counter circuit 820 incrementally increasing its digital count value. In this regard, blocks 1010 and 1015 occur in parallel, where the integrator output signal may increase until the time $t=t_0+t_1$ and, likewise, the digital count value may increase in increments until the time $t=t_0+$.

At block 1020, the counter circuit 820 resets its digital count value. For example, the digital count value may be reset (e.g., set to zero or other predetermined value) at time $t=t_0+t_1$, as denoted in FIG. 9. Once reset, the counter circuit begins incrementing its digital counter value again in a linear manner.

At block 1025, the integrator generates its integrator output signal based on a first reference signal. For example, with reference to FIG. 9, the integrator output signal ramps down in voltage in a linear manner based on a reference voltage $-V_{ref}$. The integrator receives the reference signal $-V_{ref}$ as input when the second switch is closed and the first switch is open (e.g., to decouple the integrator from the detector signal $V_{in}$). The reference signal may be generated by a reference generator (e.g., the reference generator 305) and provided to the integrator. In an aspect, the integrator ramps down its integrator output signal synchronously with the counter circuit 820 incrementally increasing its digital count value again. In this regard, for example, the integrator output signal may decrease until a time $t=t_0+t_2$ and, likewise, the digital count value may increase in increments until a time $t=t_0+t_2$. In FIG. 9, at $t=t_0+t_2$, the digital count value (e.g., denoted as $N_{out}$) is captured.

At block 1030, a comparator (e.g., a corresponding one of the comparators 810 connected to the integrator) compares the integrator output signal (e.g., voltage) with a second reference signal (e.g., a threshold voltage). The second reference signal may be denoted as $V_{th}$ and generated by a reference generator. In one case, a first reference generator may generate the first reference signal (e.g., $-V_{ref}$) and a second reference generator may generate the second reference signal (e.g., $V_{th}$). In an aspect, $V_{th}$ may be associated with a threshold voltage of the comparators 810. As an example, $V_{th}$ may be approximately between 0.5 V and 0.7 V.

At block 1035, the comparator generates a comparator output signal based on the comparison between the integrator output signal and the second reference signal (e.g., $V_{th}$). For example, the comparator may generate a comparator output signal at or associated with a first state (e.g., logic low) when the integrator output voltage exceeds the second reference signal, and the comparator may generate a comparator output signal at or associated with a second state (e.g., logic high) when the integrator output signal does not exceed the second reference signal. In this example, the comparator output signal transitions from the first state to the second state when the integrator output voltage goes from exceeding the second reference signal to not exceeding the second reference signal.

At block 1040, a determination is made, based on operation of the comparator and a pulse generator (e.g., one of the pulse generators 815 of FIG. 8), as to whether the comparator output signal transitioned (e.g., from the first state to the second state). If the determination is that the comparator output signal did not transition, the process 1000 proceeds to block 1030, in which the comparator continues to compare the integrator output signal to the second reference signal.

If the determination is that the comparator output signal transitioned, the process 1000 proceeds to block 1045. At block 1045, a pulse generator (e.g., one of pulse generators 815 of FIG. 8) generates a pulse signal in response to the transition in the comparator output signal. The pulse generator may detect an edge of the comparator output transition. For example, the edge of the comparator output transition may be a rising edge or falling edge dependent on implementation. The pulse signal is provided to a memory element (e.g., of the memory 825 of FIG. 8).

At block 1050, the memory element captures a digital count value from a counter circuit (e.g., the counter circuit 820 of FIG. 8) in response to receiving the pulse signal from the pulse generator. The pulse signal may be used as a clocking signal for the memory element to capture the digital count value from the counter circuit. The memory element may include a latch that uses the pulse signal as a clocking signal to latch (e.g., store, capture) the digital count value from the counter circuit. The digital count value is associated with the detector signal that the integrator received as input since operation of each the integrators 805, the comparators 810, and the pulse generators 815 is based on the detector signal. In an aspect, such a relation between the operation of these components and the detector signal may be appreciated in that the digital count value is captured in response to the pulse signal which in turn is generated in response to a transition of the integrator output signal, the integrator output signal and the digital count value are synchronized, and a slope (e.g., upward slope) of the integrator output signal and a value reached by the integrator output signal at $t=t_0+t_1$ is based on the detector signal. In this regard, the digital count value is a digital representation of the detector signal.

Figure 11:
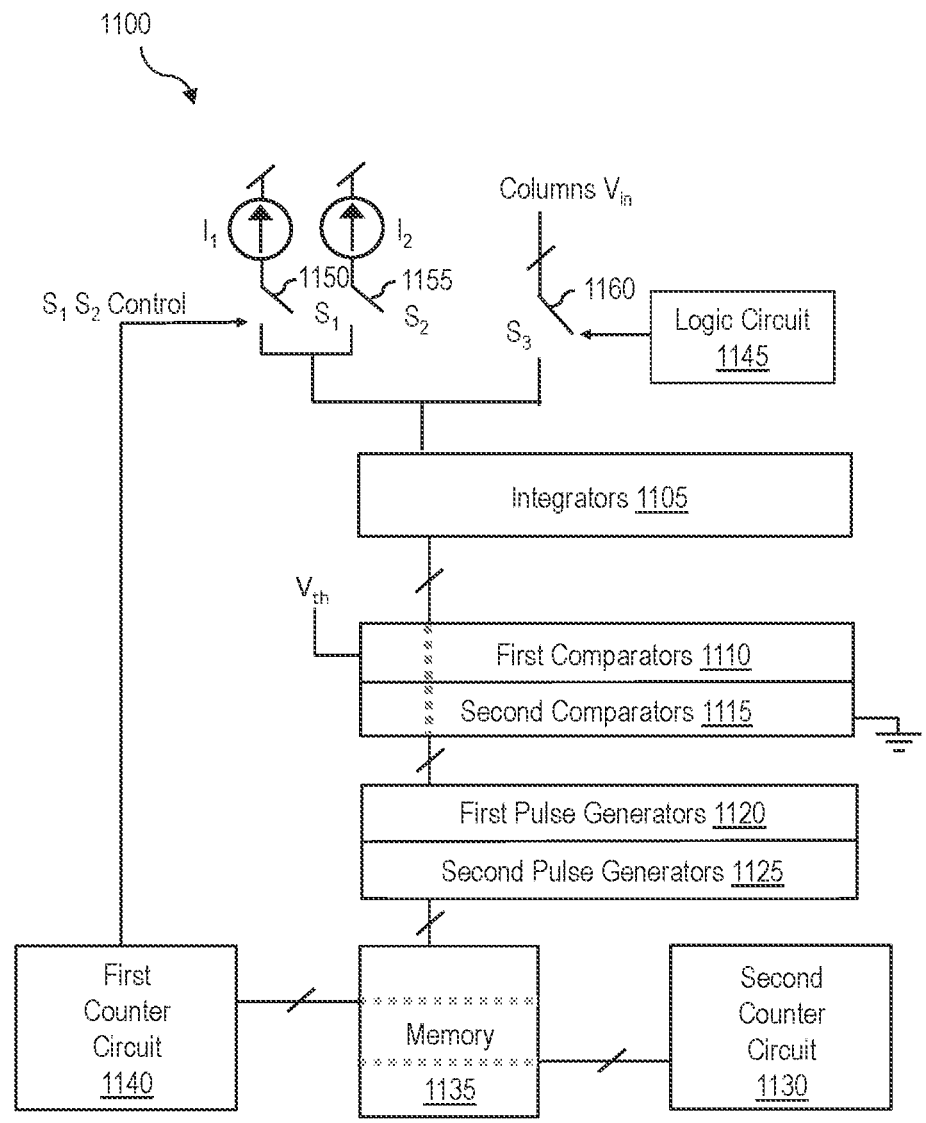
FIG. 11 illustrates a block diagram of an example analog-to-digital converter in accordance with one or more embodiments of the present disclosure.

FIG. 11 illustrates a block diagram of an example ADC 1100 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the ADC 1100 may receive detector signals from the pixel array 335 of the image sensor circuitry 350 shown in FIG. 3. For example, in an embodiment, the ADC 1100 may be utilized in place of the ADC 300 in FIG. 3.

The ADC 1100 includes integrators 1105, first comparators 1110, second comparators 1115, first pulse generators 1120, second pulse generators 1125, memory 1135, a first counter circuit 1140, a second counter circuit 1130, and a logic circuit 1145. Each of the integrators 1105 generates an integrator output signal based on an input signal provided to the integrator. In FIG. 11, each of the integrators 1105 selectively receives a respective detector signal $V_{in}$ (e.g., generated by a respective detector of the pixel array 335), selectively receives a reference current signal $I_1$, or selectively receives a reference current signal $I_2$. For example, the reference current signal $I_1$ may be generated using a first reference generator (e.g., a first current source) and the reference current signal $I_2$ may be generated using a second reference generator (e.g., a second current source). Such switching may be implemented by switches 1150, 1155, and 1160. The switches 1150, 1155, and 1160 are denoted as $S_1$, $S_2$, and $S_3$, respectively, and may be referred to as first reference signal switches, second reference signal switches, and detector signal switches. As an example, $I_2$ may be equal to $I_1/255$.

Each of the integrators 1105 may receive a detector signal from a detector of a column of a pixel array (e.g., the pixel array 335 of FIG. 3) when a corresponding detector switch closes (e.g., denoted as $S_3$ in FIG. 11). The logic circuit 1145 may be operated to control $S_3$ to selectively couple the detector signal to the integrators 1105. For a given integrator, at a time that $S_3$ closes, the integrator begins to integrate the detector signal. The integrator may integrate the detector signal until a time when $S_3$ opens and $S_1$ closes. In one case, the integrator output signal may ramp up (e.g., linearly increase with time) while the detector signal is provided to the integrator.

At a time that $S_1$ closes, the integrator receives the first reference signal $I_1$, which causes a capacitor of the integrator to discharge. While the capacitor discharges, the integrator generates an integrator output signal that linearly decreases with time. The integrator continues to generate a linearly decreasing output in response to receiving the first reference signal $I_1$ until a time when $S_1$ opens and $S_2$ closes. At a time that $S_2$ closes, the integrator receives the second reference signal $I_2$, which causes the integrator to continue discharging and further generate a linearly decreasing output signal until the integrator output signal reaches zero (e.g., 0 V). In cases that the second reference signal $I_2$ is different from the first reference signal $I_1$, the integrator discharges at a different rate when the second reference signal $I_2$ is received by the integrator than when the first reference signal $I_1$ is received by the integrator.

The first comparators 1110 compare integrator output signals (e.g., voltages) from the integrators 1105 with a third reference signal $V_{th}$ and generates comparator output signals based on the comparisons. In an aspect, the third reference signal $V_{th}$ may be generated by a reference generator. The third reference signal $V_{th}$ may be based on a threshold voltage associated with the first comparators 1110 and the second comparators 1115. In an aspect, $V_{th}$ may be approximately between 0.5 V to 0.7 V.

For a given comparator of the first comparators 1110, the comparator receives an output signal from an integrator (e.g., a corresponding integrator of the integrators 1105) and the third reference signal $V_{th}$, and generates a comparator output signal based on a comparison of the signals. In an aspect, the comparator may generate a comparator output signal at or otherwise associated with a first state/level when the integrator signal exceeds the third reference signal $V_{th}$, and generate a comparator output signal at or otherwise associated with a second state/level different from the first level when the integrator signal does not exceed the third reference signal $V_{th}$. The first state/level may be a logic low (e.g., logic level '0') and the second state/level may be a logic high (e.g., logic level '1'), or vice versa. As an example, when the first state/level is a logic low and the second state/level is a logic high, the comparator output transitions from high when the integrator signal exceeds the third reference signal $V_{th}$ to low when the integrator signal does not exceed the third reference signal $V_{th}$.

The second comparators 1115 compare integrator output signals (e.g., voltages) from integrators 1105 with a ground level (e.g., 0 V, also referred to as ground reference level) and generates comparator output signals based on the comparisons. For example, for a given second comparator, a first input terminal of the second comparator may be coupled to the integrator output signal and a second input terminal of the second comparator may be tied to ground. In this regard, the second comparator may receive an output signal from an integrator (i.e., the corresponding integrator of the integrators 1105 described above with respect to the first comparators 1110), compares the integrator output signal in relation to ground, and generate a comparator output signal based on the comparison. In an aspect, the comparator may generate a comparator output signal at or otherwise associated with a first state/level when the integrator signal is at a higher level (e.g., voltage potential) than ground, and generate a comparator output signal at or otherwise associated with a second state/level different from the first level when the integrator signal does not exceed (e.g., reaches) ground voltage. The first state/level may be a logic low (e.g., logic level '0') and the second state/level may be a logic high (e.g., logic level '1'), or vice versa. As an example, when the first state/level is a logic low and the second state/level is a logic high, the comparator output transitions from high when the integrator signal exceeds ground voltage to low when the integrator signal does not exceed, or reaches, ground voltage.

The first pulse generators 1120 receive comparator output signals from the first comparators 1110. In an aspect, for a given pulse generator of the first pulse generators 1120, the pulse generator may generate a pulse in response to a transition of a comparator output signal received by the pulse generator from the first state (e.g., logic low) to the second state (e.g., logic high). In this regard, an output transition from one of the first comparators 1110 may cause a corresponding one of the first pulse generators 1120 to transmit a pulse signal to a respective memory element of the memory 1135. In some cases, the pulse signal may be between 1 ns and 2 ns in duration. In an aspect, the pulse signal duration may be set to be less than a duration associated with a period of the first counter circuit 1140.

The second pulse generators 1125 receive comparator output signals from the second comparators 1115. In an aspect, for a given pulse generator of the second pulse generators 1125, the pulse generator may generate a pulse in response to a transition of a comparator output signal received by the pulse generator from the first state (e.g., logic low) to the second state (e.g., logic high). In this regard, an output transition from one of the second comparators 1115 may cause a corresponding one of the second pulse generators 1125 to transmit a pulse signal to a respective memory element of the memory 1135. In some cases, the pulse signal may be between 1 ns and 2 ns in duration. In an aspect, the pulse signal duration may be set to be less than a duration associated with a period of the second counter circuit 1130. In some cases, the period of the first counter circuit 1140 may be the same as the period of the second counter circuit 1130.

Memory elements of the memory 1135 receive a first pulse signal from their respective first pulse generators 1120 and a second pulse signal from their respective second pulse generators 1125. In an embodiment, the memory 1135 may be static memory (e.g., the memory elements may be static memory elements). The memory elements of the memory 1135 may include, for example, a latch or flip-flop circuit to store data (e.g., a digital count value). In an aspect, the memory elements may include inverter devices or circuitry that are not actively driven by the counter circuits 1140 and 1130. The memory elements may include crossed-coupled inverters.

The first counter circuit 1140 adjusts a first digital count value as a function of time. For example, the first digital count value may be incremented according to a system clock, such as may be provided by the control bias and timing circuitry 235 of FIG. 2A. In an embodiment, the counter circuit 1140 provides control bits to operate (e.g., selective close or open) switches $S_1$ and $S_2$. When $S_1$ is closed, the first counter circuit 1140 may synchronously adjust the first digital count value in tandem with adjustment of the integrator output signal by the integrators 1105 based on the reference signal $I_1$.

The second counter circuit 1130 adjusts a second digital count value as a function of time. For example, the second digital count value may be incremented according to a system clock, such as may be provided by the control bias and timing circuitry 235 of FIG. 2A. In an aspect, the system clock that is utilized by the first counter circuit 1140 and the second counter circuit 1130 to generate the first digital count value and the second digital count value is the same. In an embodiment, the second counter circuit 1130 operates synchronously with the integrators 1105. When $S_2$ is closed, the second counter circuit 1130 may synchronously adjust the second digital count value in tandem with adjustment of the integrator output signal by the integrators 1105 based on the reference signal $I_2$.

In response to the first pulse signal, a first memory element may capture a first digital count value from the first counter circuit 1140. In response to the second pulse signal, a second memory element captures a second digital count value from the second counter circuit 1130. For a given detector signal $V_{in}$, the first digital count value and the second digital count value may be combined to obtain a total digital count value (e.g., also referred to as an ADC conversion value) that is indicative of the detector signal $V_{in}$. In this regard, the first digital count value and the second digital count value collectively provide a digital representation of the detector signal $V_{in}$. In some cases, the first digital count value may provide most significant bits (MSBs) of the total digital count value and the second digital count value may provide least significant bits (LSBs) of the total digital count value. In some cases, the first digital count value may contribute a coarse conversion of the detector signal $V_{in}$ and the second digital count value may contribute a fine component associated with the detector signal $V_{in}$. As such, in an embodiment, a first digital count value stored in the memory 1135 and its corresponding second digital count value stored in the memory 1135, when combined, provides a digital representation (e.g., ADC conversion value) of a respective detector signal generated by a respective detector of the pixel array 335.

Figure 12:
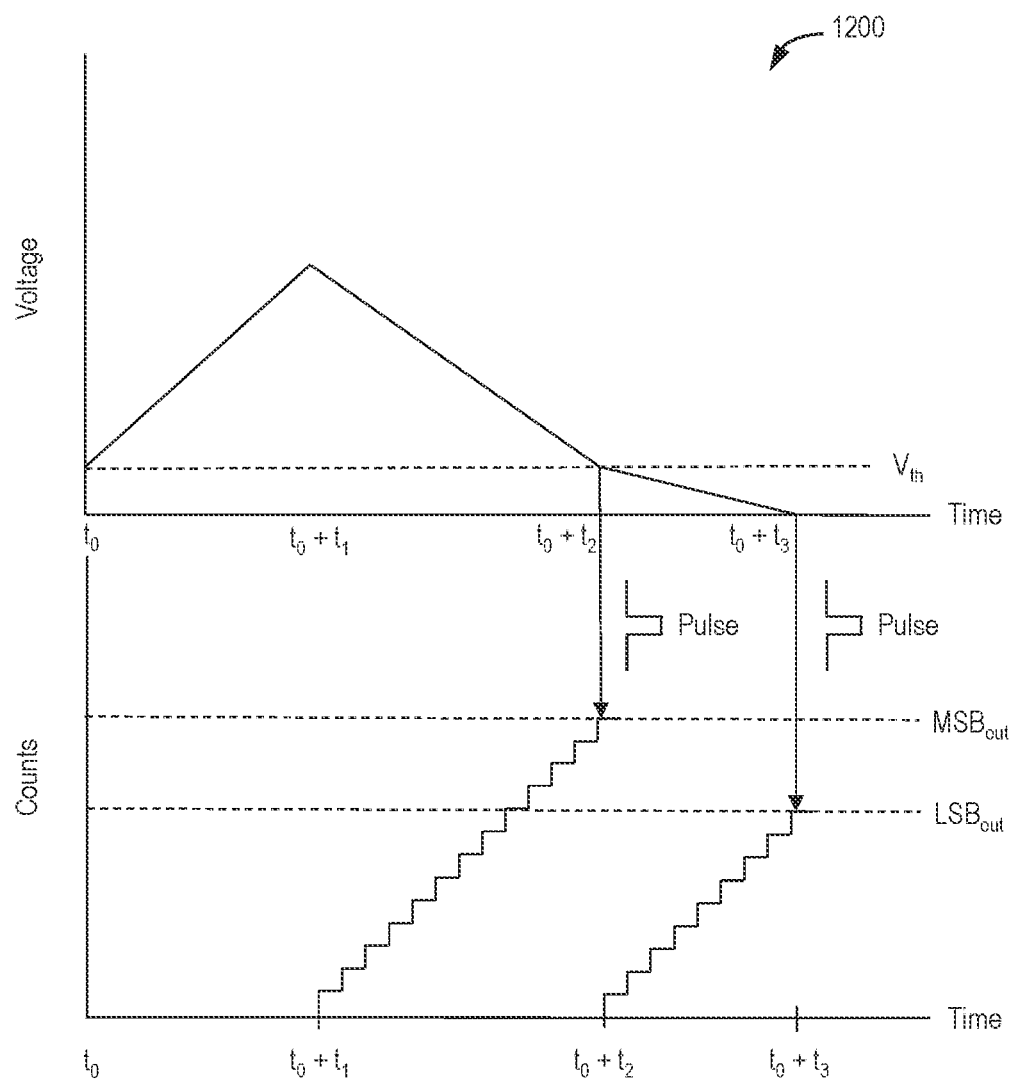
FIG. 12 illustrates a graph associated with operation of the analog-to-digital converter of FIG. 11 in accordance with one or more embodiments of the present disclosure.

FIG. 12 illustrates a graph 1200 associated with operation of the ADC 1100 in accordance with one or more embodiments of the present disclosure. Initially, in an embodiment, to facilitate conversion of detector signals from a pixel array (e.g., the pixel array 335 of FIG. 3), each of the integrators 1105, the first counter circuit 1140, and the second counter circuit 1130 may be reset at a time $t=t_0$. For example, the reset may be performed such that the first counter circuit 1140 and the second counter circuit 1130 are at a zero digital count value and the integrator output is at a threshold voltage (e.g., the reference signal $V_{th}$). At $t=t_0$, $S_1$ and $S_2$ may be open and $S_3$ may be closed. For a given integrator, at the moment that $S_3$ is closed, the integrator begins to generate an integrator output signal. In an embodiment, the integrator output signal may be a positive voltage ramp beginning from $V_{th}$. In an aspect, the slope of the voltage ramp is proportional to the detector signal $V_{in}$ provided as an input to the integrator when S3 is closed.

At time $t=t_0+t_1$ (e.g., after a duration $t_1$ has passed since beginning to ramp up the integrator output voltage and the first digital count value), $S_3$ opens and $S_1$ closes to allow providing of the first reference signal $I_1$ to the integrators' input. In an aspect, $t_1$ may be a predetermined amount of time. In some cases, $t_1$ may be set by a user. At time $t=t_0+t_1$, the first counter circuit 1140 begins synchronously adjusting the first digital count value in tandem with adjustment of a downward ramp voltage for the integrators output signal as capacitors of the integrators discharge.

At time $t=t_0+t_2$, the integrator output signal reaches (e.g., meets, crosses, equals) a threshold voltage $V_{th}$. At this time, in response to comparing the integrator output signal with the threshold voltage $V_{th}$ and determining that the integrator output signal reached the threshold voltage $V_{th}$, a comparator of the first comparators 1110 generates a comparator output signal that transitions (e.g., from high to low or low to high depending on implementation). A respective one of the first pulse generators 1120 determines a rising or falling edge of the comparator output transition and, in response, generates a first pulse signal. The first pulse signal may be received at a memory element of the memory 1135, and, in response to receiving the first pulse signal, the memory element may capture the first digital count value (denoted as $MSB_{out}$) from the first counter circuit 1140.

Additionally, at time $t=t_0+t_2$, $S_1$ opens and $S_2$ closes to allow providing of the second reference signal $I_2$ to the integrators' input. At time $t=t_0+t_2$, the second counter circuit 1130 begins synchronously adjusting the second digital count value in tandem with the adjustment of a downward ramp voltage for the integrator output signals as capacitors of the integrators continue to discharge. In an aspect, the discharge rate of the integrators when $S_2$ is closed is lower than when $S_1$ was closed (e.g., due to a difference between $I_1$ and $I_2$). As an example, $I_2$ may be $I_1/255$.

At time $t=t_0+t_3$, the integrator output signal reaches (e.g., meets, crosses, equals) a ground voltage. At this time, in response to comparing the integrator output signal with the ground voltage and determining that the integrator output signal reached the ground voltage, a comparator of the second comparators 1115 generates a comparator output signal that transitions (e.g., from high to low or low to high dependent on implementation). A respective one of the second pulse generators 1125 determines a rising or falling edge of the comparator output transition and, in response, generates a second pulse signal. The second pulse signal may be received at a memory element of the memory 1135, and, in response to receiving the second pulse signal, the memory element may capture a second digital count value (denoted as $LSB_{out}$) from the second counter circuit 1130. In an embodiment, the first and second digital count values stored in the memory 1135 collectively provide digital representations (e.g., ADC conversion values) of the detector signals generated by the detectors of the pixel array 335. In this regard, a first digital count value and its corresponding second digital count value may be combined to obtain a total digital count value. In an aspect, the total digital value is a digital representation of the detector signal $V_{in}$ utilized to obtain the first and the second digital count values.

Figure 13:
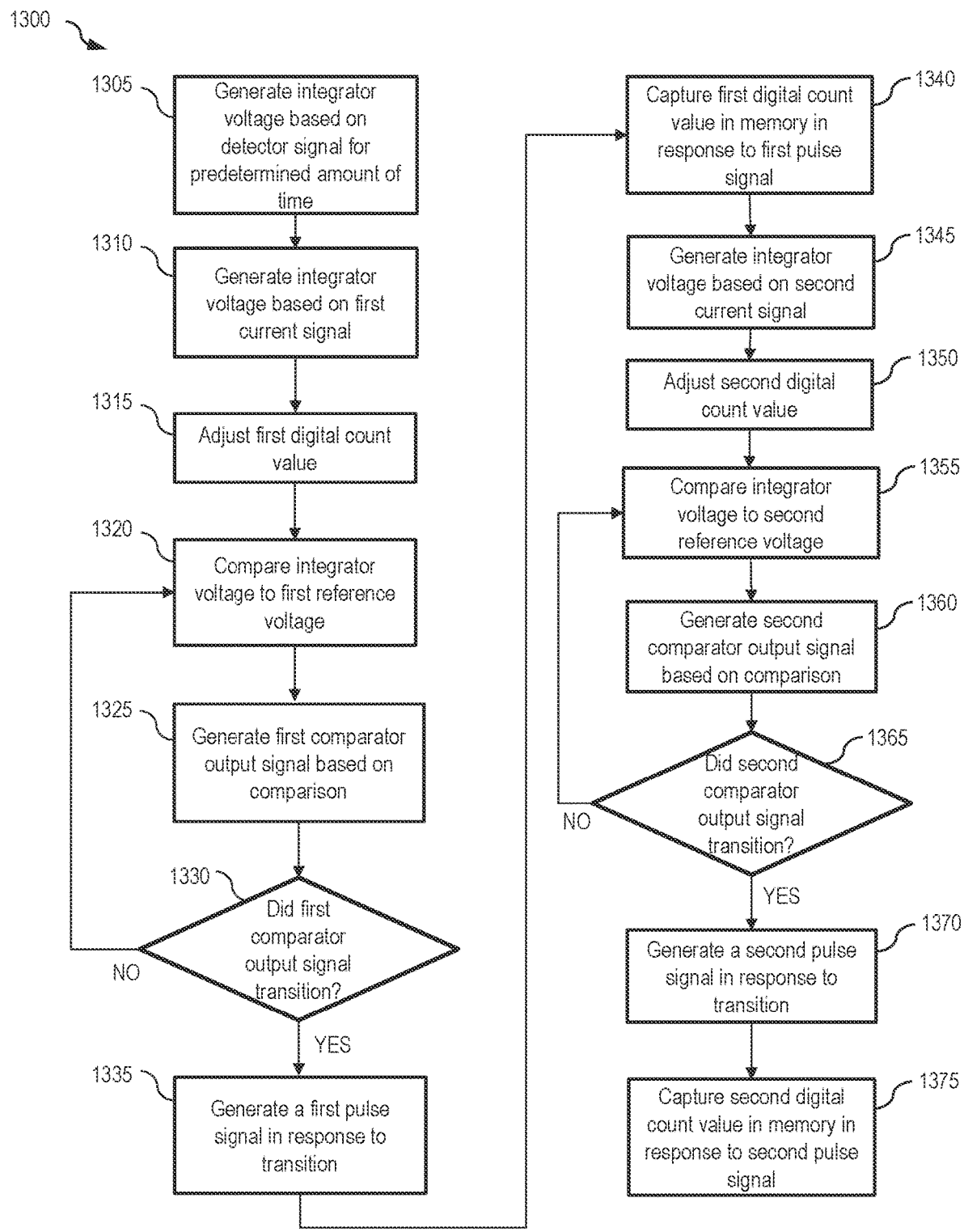
FIG. 13 illustrates a flow diagram of an example process for analog-to-digital conversion with pulse generators in accordance with one or more embodiments of the present disclosure.

FIG. 13 illustrates a flow diagram of an example process 1300 for analog-to-digital conversion with pulse generators in accordance with one or more embodiments of the present disclosure. For explanatory purposes, the example process 1300 is primarily described herein with reference to FIGS. 11 and 12; however, the example process 1300 is not limited to FIGS. 11 and 12. The blocks of example process 1300 are described herein as occurring in serial, or linearly (e.g., one after another). However, multiple blocks of example process 1300 may occur in parallel. In addition, the blocks of example process 1300 need not be performed in the order shown and/or one or more of the blocks of example process 1300 need not be performed.

At block 1305, an integrator (e.g., one of the integrators 1105) generates an integrator output signal (e.g., voltage) based on the detector signal (e.g., $V_{in}$). The integrator may generate the integrator output signal based on the detector signal for a predetermined amount of time (e.g., $t_1$). In some cases, at block 1305, $S_3$ is closed and $S_1$ and $S_2$ are open. At block 1310, the integrator generates the integrator output signal based on the first reference signal (e.g., $I_1$). Block 1310 may be performed when the predetermined amount of time has elapsed. In some cases, at block 1310, $S_1$ is closed while $S_2$ and $S_3$ are open. At block 1315, the first counter circuit 1140 adjusts (e.g., increments) the first digital count value. In an aspect, block 1310 and block 1315 occur synchronously with each other.

At block 1320, a first comparator (e.g., of the first comparators 1110) compares the integrator output voltage to a first reference voltage (e.g., threshold voltage $V_{th}$). The threshold voltage may, for example, be generated by a reference generator. At block 1325, the first comparator generates a first comparator output signal based on the comparison at block 1320. At block 1330, a determination is made, based on operation of the first comparator and the first pulse generator, as to whether the first comparator output signal transitioned (e.g., from the first state to the second state). If the determination is that the first comparator output signal did not transition, the process 1300 proceeds to block 1320, in which the first comparator continues to compare the integrator output voltage to the threshold voltage.

If the determination is that the comparator output signal transitioned, the process 1300 proceeds to block 1335. At block 1335, the first pulse generator generates a first pulse signal in response to the transition of the first comparator output signal. In FIG. 12, the transition occurs at $t=t_0+t_2$. The first pulse generator may detect an edge of the first comparator output transition. For example, the edge of the first comparator output transition may be a rising edge or falling edge dependent on implementation. The first pulse signal is provided to a memory element of the memory 1135. At block 1340, the memory element captures the first digital count value from the first counter circuit 1140 in response to receiving the first pulse signal from the first pulse generator. The first pulse signal may be used as a clocking signal for the memory element to capture the first digital count value from the first counter circuit 1140. The memory element may include a latch that uses the first pulse signal as a clocking signal to latch (e.g., store, capture) the first digital count value from the first counter circuit 1140. The first digital count value is associated with the detector signal that the integrator receives as input at block 1305 since operation of each the integrators 1105, the first comparators 1110, and the first pulse generators 1120 is based on the detector signal. In an aspect, such a relation may be appreciated in that the first digital count value is captured in response to the first pulse signal which in turn is generated in response to a transition of the integrator output signal, the integrator output signal and the first digital count value are synchronized, and a slope (e.g., upward slope) of the integrator output signal and a value reached by the integrator output signal at $t=t_0+t_1$ is based on the detector signal. In this regard, in an aspect, the first digital count value may provide a coarse digital representation of the detector signal.

At block 1345, after $t=t_0+t_2$, the integrator 1105 generates the integrator output signal based on the second reference signal (e.g., $I_2$). In some cases, at block 1345, $S_2$ is closed and $S_1$ and $S_3$ are open. At block 1350, the second counter circuit 1130 adjusts (e.g., increments) the second digital count value. In an aspect, block 1345 and block 1350 occur synchronously with each other. In an aspect, the first counter circuit 1140 and the second counter circuit 1130 may be operated using the same system clock and may have the same period.

At block 1355, a second comparator (e.g., of the second comparators 1115) compares the integrator output voltage to a second reference voltage (e.g., ground voltage). At block 1360, the second comparator generates a second comparator output signal based on the comparison at block 1355. At block 1365, a determination is made, based on operation of the second comparator and the second pulse generator, as to whether the second comparator output signal transitioned (e.g., from the first state to the second state). If the determination is that the second comparator output signal did not transition, the process 1300 proceeds to block 1355, in which the second comparator continues to compare the integrator output voltage to the ground voltage.

If the determination is that the comparator output signal transitioned, the process 1300 proceeds to block 1370. At block 1370, the second pulse generator generates a second pulse signal in response to the transition of the second comparator output signal. In FIG. 12, the transition occurs at $t=t_0+t_3$. The second pulse generator may detect an edge of the second comparator output transition. For example, the edge of the second comparator output transition may be a rising edge or falling edge dependent on implementation. The second pulse signal is provided to a memory element of the memory 1135. At block 1375, the memory element captures the second digital count value from the second counter circuit 1130 in response to receiving the second pulse signal from the second pulse generator. The second pulse signal may be used as a clocking signal for the memory element to capture the second digital count value from the second counter circuit 1130. The memory element may include a latch that uses the second pulse signal as a clocking signal to latch (e.g., store, capture) the second digital count value from the second counter circuit 1130. The second digital count value is associated with the detector signal that the integrator receives as input at block 1305. In this regard, the second digital count value provides a fine component of a digital representation of the detector signal.

In an aspect, the first digital count value and the second digital count value, when combined, form a total digital count value indicative of the detector signal associated with the first and second digital count values. In some cases, the first digital count value may be MSBs of the total digital count value and the second digital count value may be LSBs of the total digital count value. In this regard, the first digital count value and the second digital count value collectively provide a digital representation of the detector signal $V_{in}$ associated with (e.g., utilized to generate) the first digital count value and the second digital count value.

Although the present disclosure generally refers to a single memory element as storing a digital count value, two or more memory elements may be utilized collectively to store the digital count value (e.g., based on a number of bits utilized to represent the digital count value). For example, in one case, the memory element 500 (e.g., of the memory 325 of FIG. 3) may store a respective portion (e.g., a respective bit) of the digital count value, such that multiple of these memory elements may be utilized to store a multi-bit digital count value. Each of these memory elements may be driven by the pulse signal CP_CLK. In an aspect, two or more memory elements of the memory 825 of FIG. 8 may be utilized collectively to store the digital count value. In an aspect, two or more memory elements of the memory 1135 of FIG. 11 may be utilized collectively to store the first digital count value, and/or two or more memory elements of the memory 1135 may be utilized collectively to store the second digital count value. Alternatively, each memory element, such as the memory element 500, may represent multi-bit storage having circuitry (e.g., number of transmission gates and cross-coupled inverters) appropriate to store a digital count value or a portion thereof.

Although the foregoing describes embodiments utilising one conversion stage (e.g., FIGS. 6 and 9) or two conversion stages (e.g., FIG. 12), other embodiments may utilize more than two conversion stages. In some aspects, multi-stage conversions are associated with multiple reference signals to be selectively provided to the integrators and multiple threshold levels to be utilized as a basis for comparison by the comparators. Each stage of the conversion may have associated comparators (e.g., and appropriate threshold levels), associated pulse generators (e.g., to generate pulse signals based on a transition in comparator output signals), and associated counter circuits. Each stage may be associated with a counter value, such that the counter values from the stages collectively provide a digital representation of the detector signals.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. An imaging system, comprising:
an analog-to-digital converter (ADC) comprising:
an integrator configured to:
selectively receive, as an integrator input signal, a detector signal or a first reference signal; and
generate an integrator output signal based on the integrator input signal;
a first comparator configured to generate a first comparator output signal based on the integrator output signal and a second reference signal, wherein the first comparator output signal is associated with a first state or a second state;
a first pulse generator coupled to the first comparator, wherein the first pulse generator is configured to generate a first pulse signal in response to a transition of the first comparator output signal from the first state to the second state; and
a memory device coupled to the first pulse generator, wherein the memory device is configured to capture a first counter value from a first counter circuit in response to the first pulse signal, wherein the first counter value is associated with the detector signal, and wherein the memory device comprises:
a first switch coupled to the first pulse generator and configured to close in response to the first pulse signal; and
a latch configured to receive at least a portion of the first counter value when the first switch is closed.

2. The imaging system of claim 1, wherein the first comparator output signal is associated with the first state when the integrator output signal exceeds the second reference signal, wherein the first comparator output signal is associated with the second state when the integrator output signal does not exceed the second reference signal, wherein the first reference signal and the second reference signal are from one or more reference generators, wherein the first reference signal has a magnitude approximately between 2.5 V and 3.3 V, and wherein the second reference signal has a magnitude approximately between 0.5 V and 0.7 V.

3. The imaging system of claim 1, further comprising:
a second comparator configured to generate a second comparator output signal based on the integrator output signal and a ground reference level; and
a second pulse generator coupled to the second comparator, wherein the second pulse generator is configured to generate a second pulse signal in response to a transition of the second comparator output signal,
wherein:
the memory device is further configured to capture a second counter value from a second counter circuit in response to the second pulse signal, and
the second counter value is associated with the detector signal.

4. The imaging system of claim 3, wherein the second comparator output signal is associated with a first state when the integrator output signal exceeds the ground reference level, wherein the second comparator output signal is associated with a second state when the integrator output signal does not exceed the ground reference level, and wherein the second pulse generator is configured to generate the second pulse signal in response to a transition of the second comparator output signal from the first state to the second state.

5. The imaging system of claim 3, wherein the first counter value and the second counter value collectively provide a digital representation of the detector signal.

6. The imaging system of claim 1, further comprising:
a second switch configured to selectively couple the detector signal to the integrator; and
a third switch configured to selectively couple the first reference signal to the integrator,
wherein the integrator is configured to:
generate the integrator output signal based on the detector signal for a first duration of time; and
generate the integrator output signal based on the first reference signal for a second duration of time after the first duration of time.

7. The imaging system of claim 1, wherein the first pulse generator is further configured to generate a delayed version of the first comparator output signal, wherein the first pulse signal is based on the first comparator output signal and the delayed version of the first comparator output signal, and wherein the memory device comprises a static memory device.

8. The imaging system of claim 1, further comprising a detector array configured to detect electromagnetic radiation and generate the detector signal based on the detected electromagnetic radiation, wherein the ADC is part of the detector array or a readout circuit, and wherein the memory device further comprises:
a second switch configured to be turned off when the first switch is closed, wherein the second switch is coupled to the latch and the first switch.

9. The imaging system of claim 1, wherein the first switch comprises a first transmission gate coupled to the first pulse generator, and wherein the first transmission gate is configured to receive the first pulse signal and a second pulse signal complementary to the first pulse signal.

10. The imaging system of claim 9, wherein the memory device further comprises a second transmission gate coupled to the first transmission gate and the latch.

11. An imaging system comprising:
an analog-to-digital converter (ADC) comprising:
an integrator configured to:
selectively receive, as an integrator input signal, a detector signal, a first reference signal, or a second reference signal;
generate an integrator output signal based on the integrator input signal by:
generating the integrator output signal based on the detector signal for a first duration of time;
generating the integrator output signal based on the first reference signal for a second duration of time after the first duration of time; and
generating the integrator output signal based on the second reference signal for a third duration of time after the second duration of time;
a first comparator configured to generate a first comparator output signal based on the integrator output signal and a third reference signal, wherein the first comparator output signal is associated with a first state or a second state;
a first pulse generator coupled to the first comparator, wherein the first pulse generator is configured to generate a first pulse signal in response to a transition of the first comparator output signal from the first state to the second state; and
a memory device coupled to the first pulse generator, wherein the memory device is configured to capture a first counter value from a first counter circuit in response to the first pulse signal, and wherein the first counter value is associated with the detector signal.

12. The imaging system of claim 11, further comprising:
a first switch configured to selectively couple the detector signal to the integrator;
a second switch configured to selectively couple the first reference signal to the integrator; and
a third switch configured to selectively couple the second fourth reference signal to the integrator.

13. The imaging system of claim 12, wherein the first counter circuit is configured to selectively control the second switch and the third switch.

14. The imaging system of claim 11, wherein the first reference signal, the second reference signal, and the third reference signal are from one or more reference generators.

15. The imaging system of claim 11, wherein the memory device comprises a transmission gate and an inverter coupled to the transmission gate, and wherein the transmission gate is configured to receive the first pulse signal and a second pulse signal complementary to the first pulse signal.

16. A method for analog-to-digital conversion comprising:
selectively receiving, by an integrator as an integrator input signal, a detector signal or a first reference signal;
generating, by the integrator, an integrator output signal based on the integrator input signal;
generating, by a first comparator, a first comparator output signal based on the integrator output signal and a second reference signal, wherein the first comparator output signal is associated with a first state or a second state;
in response to a transition of the first comparator output signal from the first state to the second state, generating, by a first pulse generator coupled to the first comparator, a first pulse signal; and
in response to the first pulse signal, capturing, by a memory device coupled to the first pulse generator, a first counter value from a first counter circuit, wherein the first counter value is associated with the detector signal, wherein the memory device comprises a switch and a latch, wherein the switch is coupled to the first pulse generator and is configured to close in response to the first pulse signal, and wherein the latch is configured to receive at least a portion of the first counter value when the switch is closed.

17. The method of claim 16, further comprising:
generating, by a second comparator, a second comparator output signal based on the integrator output signal and a ground reference level;
in response to a transition of the second comparator output signal, generating, by a second pulse generator, a second pulse signal; and
in response to the second pulse signal, capturing, by the memory device, a second counter value from a second counter circuit, wherein the second counter value is associated with the detector signal.

18. The method of claim 16, further comprising:
detecting, by a detector array, electromagnetic radiation;
generating, by the detector array, the detector signal based on the detected electromagnetic radiation; and
generating, by the first pulse generator, a delayed version of the first comparator output signal, wherein the first pulse signal is based on the first comparator output signal and the delayed version of the first comparator output signal.

19. The method of claim 16, wherein:
the first reference signal comprises a third reference signal or a fourth reference signal;
the selectively receiving comprises selectively receiving, as the integrator input signal, the detector signal, the third reference signal, or the fourth reference signal; and
the generating the integrator output signal comprises:
generating, by the integrator, the integrator output signal based on the detector signal for a first duration of time; and
generating, by the integrator, the integrator output signal based on the third reference signal for a second duration of time after the first duration of time; and
generating, by the integrator, the integrator output signal based on the fourth reference signal for a third duration of time after the second duration of time.

20. The method of claim 16, wherein the generating the integrator output signal comprises:
generating, by the integrator, the integrator output signal based on the detector signal for a first duration of time; and generating, by the integrator, the integrator output signal based on the first reference signal for a second duration of time after the first duration of time.

\* \* \* \* \*

UNITED STATES PATENT AND TRADEMARK OFFICE
CERTIFICATE OF CORRECTION

PATENT NO. : 12,063,445 B2
APPLICATION NO. : 17/362876
DATED : August 13, 2024
INVENTOR(S) : Kevin N. Ye Page 1 of 1

It is certified that error appears in the above-identified patent and that said Letters Patent is hereby corrected as shown below:

In the Specification

In the Detailed Description:
Column 25, Line 2, change "until the time $t=t_0+$" to --until the time $t=t_0+t_1$--.

In the Claims

Claim 12, Column 35, Lines 55-56, change "couple the second fourth reference signal" to --couple the second reference signal--.

Signed and Sealed this
Twenty-ninth Day of October, 2024

*Katherine Kelly Vidal*

Katherine Kelly Vidal
*Director of the United States Patent and Trademark Office*